US008993360B2

(12) United States Patent
Choi et al.

(10) Patent No.: US 8,993,360 B2
(45) Date of Patent: Mar. 31, 2015

(54) DEPOSITION APPARATUS, METHOD OF MANUFACTURING ORGANIC LIGHT EMITTING DISPLAY APPARATUS, AND ORGANIC LIGHT EMITTING DISPLAY APPARATUS

(71) Applicant: Samsung Display Co., Ltd., Yongin, Gyeonggi-Do (KR)

(72) Inventors: Woon-Hyun Choi, Yongin (KR); Kyung-Han Kim, Yongin (KR); Myong-Hwan Choi, Yongin (KR); Kyoung-Won Oh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/951,374

(22) Filed: Jul. 25, 2013

(65) Prior Publication Data

US 2014/0291620 A1 Oct. 2, 2014

(30) Foreign Application Priority Data

Mar. 29, 2013 (KR) ........................ 10-2013-0034691

(51) Int. Cl.
*H01L 21/00* (2006.01)
*H01L 51/56* (2006.01)
*H01L 51/52* (2006.01)

(52) U.S. Cl.
CPC ............ *H01L 51/56* (2013.01); *H01L 51/5203* (2013.01)
USPC .............................................. 438/34; 438/22

(58) Field of Classification Search
USPC .................................................... 438/22, 34
See application file for complete search history.

(56) References Cited

U.S. PATENT DOCUMENTS

| 4,687,939 | A | 8/1987 | Miyauchi et al. |
| 6,091,195 | A | 7/2000 | Forrest et al. |
| 6,274,198 | B1 | 8/2001 | Dautartas |
| 6,280,821 | B1 | 8/2001 | Kadunce et al. |
| 6,371,451 | B1 | 4/2002 | Choi |
| 6,475,287 | B1 | 11/2002 | Clark |
| 6,749,906 | B2 | 6/2004 | Van Slyke |
| 6,878,209 | B2 | 4/2005 | Himeshima et al. |
| 6,946,783 | B2 | 9/2005 | Kim |

(Continued)

FOREIGN PATENT DOCUMENTS

| EP | 1 413 644 A2 | 4/2004 |
| EP | 1 418 250 A2 | 5/2004 |

(Continued)

OTHER PUBLICATIONS

Machine English Translation for JP-2001-052862 A, dated Feb. 23, 2001 listed above.

(Continued)

*Primary Examiner* — Alexander Ghyka
(74) *Attorney, Agent, or Firm* — Christie, Park & Hale, LLP

(57) ABSTRACT

A deposition apparatus for depositing a deposition material on a substrate in order to improve characteristics of a deposition layer includes: a deposition source facing the substrate and ejecting the deposition material; a patterning slit sheet including patterning slits for depositing the deposition material in a desired pattern and disposed to face the substrate; a frame coupled to the patterning slit sheet; and a stage bonded to the frame to support the frame, wherein a separation area is formed between the frame and the stage.

5 Claims, 13 Drawing Sheets

(56) References Cited

U.S. PATENT DOCUMENTS

| | | | |
|---|---|---|---|
| 7,006,202 B2 | 2/2006 | Byun et al. | |
| 7,521,097 B2 * | 4/2009 | Horne et al. | 427/585 |
| 8,188,476 B2 | 5/2012 | Takagi et al. | |
| 8,193,011 B2 | 6/2012 | Kang et al. | |
| 2001/0006827 A1 | 7/2001 | Yamazaki et al. | |
| 2002/0017245 A1 | 2/2002 | Tsubaki et al. | |
| 2002/0076847 A1 | 6/2002 | Yamada et al. | |
| 2002/0168577 A1 | 11/2002 | Yoon | |
| 2003/0101932 A1 | 6/2003 | Kang | |
| 2003/0101937 A1 | 6/2003 | Van Slyke et al. | |
| 2003/0118950 A1 | 6/2003 | Chao et al. | |
| 2003/0168013 A1 | 9/2003 | Freeman et al. | |
| 2003/0221614 A1 | 12/2003 | Kang et al. | |
| 2003/0232563 A1 | 12/2003 | Kamiyama et al. | |
| 2004/0115338 A1 | 6/2004 | Yoneda | |
| 2004/0115342 A1 | 6/2004 | Shigemura | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0183435 A1 | 9/2004 | Oshita | |
| 2004/0194702 A1 | 10/2004 | Sasaki et al. | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0072361 A1 | 4/2005 | Yang et al. | |
| 2005/0110400 A1 | 5/2005 | Nakamura | |
| 2005/0166842 A1 | 8/2005 | Sakamoto | |
| 2005/0263074 A1 | 12/2005 | Masuda et al. | |
| 2006/0022590 A1 | 2/2006 | Aziz et al. | |
| 2006/0110544 A1 | 5/2006 | Kim et al. | |
| 2006/0113907 A1 | 6/2006 | Im et al. | |
| 2006/0144325 A1 | 7/2006 | Jung et al. | |
| 2006/0174829 A1 | 8/2006 | An et al. | |
| 2006/0205101 A1 | 9/2006 | Lee et al. | |
| 2007/0022955 A1 | 2/2007 | Bender et al. | |
| 2007/0054044 A1 | 3/2007 | Shimosaki et al. | |
| 2007/0077358 A1 | 4/2007 | Jeong et al. | |
| 2007/0148337 A1 | 6/2007 | Nichols et al. | |
| 2007/0157879 A1 | 7/2007 | Yotsuya | |
| 2007/0163497 A1 | 7/2007 | Grace et al. | |
| 2007/0178708 A1 | 8/2007 | Ukigaya | |
| 2008/0018236 A1 | 1/2008 | Arai et al. | |
| 2008/0115729 A1 | 5/2008 | Oda et al. | |
| 2008/0129194 A1 | 6/2008 | Abe et al. | |
| 2008/0131587 A1 | 6/2008 | Boroson et al. | |
| 2008/0145521 A1 | 6/2008 | Guo et al. | |
| 2008/0174235 A1 | 7/2008 | Kim et al. | |
| 2008/0216741 A1 | 9/2008 | Ling et al. | |
| 2008/0238294 A1 | 10/2008 | Xu et al. | |
| 2009/0017192 A1 | 1/2009 | Matsuura | |
| 2009/0220691 A1 | 9/2009 | Kim | |
| 2009/0232976 A1 | 9/2009 | Yoon et al. | |
| 2009/0277386 A1 | 11/2009 | Takagi et al. | |
| 2010/0001301 A1 | 1/2010 | Karg et al. | |
| 2010/0055810 A1 | 3/2010 | Sung et al. | |
| 2010/0192856 A1 | 8/2010 | Sung et al. | |
| 2010/0271602 A1 | 10/2010 | Hanazaki | |
| 2011/0220019 A1 | 9/2011 | Lee et al. | |
| 2011/0220022 A1 * | 9/2011 | Hong et al. | 118/663 |
| 2012/0145772 A1 * | 6/2012 | Chang et al. | 118/712 |
| 2013/0009177 A1 * | 1/2013 | Chang et al. | 257/88 |
| 2013/0084669 A1 * | 4/2013 | Black et al. | 438/61 |
| 2014/0014917 A1 * | 1/2014 | Lee et al. | 257/40 |
| 2014/0084263 A1 * | 3/2014 | Jin et al. | 257/40 |
| 2014/0326962 A1 * | 11/2014 | Lee et al. | 257/40 |
| 2014/0329349 A1 * | 11/2014 | Seo | 438/34 |

FOREIGN PATENT DOCUMENTS

| | | |
|---|---|---|
| EP | 1 518 940 A1 | 3/2005 |
| JP | 04-272170 A | 9/1992 |
| JP | 2000-068054 A | 3/2000 |
| JP | 2001-052862 A | 2/2001 |
| JP | 2001-093667 A | 4/2001 |
| JP | 2002-075638 A | 3/2002 |
| JP | 2002-175878 A | 6/2002 |
| JP | 2003-003250 A | 1/2003 |
| JP | 2003-077662 A | 3/2003 |
| JP | 2003-157973 A | 5/2003 |
| JP | 2003-297562 A | 10/2003 |
| JP | 2003-321767 A | 11/2003 |
| JP | 2004-043898 A | 2/2004 |
| JP | 2004-103269 A | 4/2004 |
| JP | 2004-103341 A | 4/2004 |
| JP | 2004-169169 A | 6/2004 |
| JP | 2004-199919 A | 7/2004 |
| JP | 2004-349101 A | 12/2004 |
| JP | 2005-044592 A | 2/2005 |
| JP | 2005-122980 A | 5/2005 |
| JP | 2005-174843 A | 6/2005 |
| JP | 2005-235568 A | 9/2005 |
| JP | 2005-293968 A | 10/2005 |
| JP | 2005-296737 A | 10/2005 |
| JP | 2006-210038 A | 8/2006 |
| JP | 2006-275433 A | 10/2006 |
| JP | 2007-047293 A | 2/2007 |
| JP | 2007-186740 A | 7/2007 |
| JP | 2008-108628 A | 5/2008 |
| JP | 2008-121098 A | 5/2008 |
| JP | 2008-521165 A | 6/2008 |
| JP | 2009-019243 A | 1/2009 |
| JP | 2009-87910 A | 4/2009 |
| KR | 10-0257219 B1 | 2/2000 |
| KR | 10-2000-0019254 A | 4/2000 |
| KR | 10-2000-0023929 A | 5/2000 |
| KR | 10-2001-0024652 A | 3/2001 |
| KR | 10-2001-0059939 A | 7/2001 |
| KR | 20-0257218 Y1 | 11/2001 |
| KR | 10-2002-0000201 A | 1/2002 |
| KR | 10-2002-0001555 A | 1/2002 |
| KR | 10-2002-0050922 A | 6/2002 |
| KR | 10-2002-0090934 A | 12/2002 |
| KR | 10-2003-0001745 A | 1/2003 |
| KR | 2003-0004073 A | 1/2003 |
| KR | 10-2003-0046090 A | 6/2003 |
| KR | 2003-0069684 A | 8/2003 |
| KR | 10-0405080 B1 | 11/2003 |
| KR | 10-2003-0091947 A | 12/2003 |
| KR | 10-2003-0093959 A | 12/2003 |
| KR | 10-2004-0034537 A | 4/2004 |
| KR | 10-2004-0050045 A | 6/2004 |
| KR | 10-2004-0069281 A | 8/2004 |
| KR | 10-2004-0084747 A | 10/2004 |
| KR | 10-0463212 B1 | 12/2004 |
| KR | 10-2005-0062853 A | 6/2005 |
| KR | 10-0520159 B1 | 10/2005 |
| KR | 10-2006-0006178 A | 1/2006 |
| KR | 10-2006-0008602 A | 1/2006 |
| KR | 10-2006-0018745 A | 3/2006 |
| KR | 10-2006-0020050 A | 3/2006 |
| KR | 10-2006-0049050 A | 5/2006 |
| KR | 10-2006-0056706 A | 5/2006 |
| KR | 10-2006-0058459 A | 5/2006 |
| KR | 10-2006-0059068 A | 6/2006 |
| KR | 10-2006-0065978 A | 6/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0092387 A | 8/2006 |
| KR | 10-2006-0098755 A | 9/2006 |
| KR | 10-2006-0104675 A | 10/2006 |
| KR | 10-2006-0104677 A | 10/2006 |
| KR | 10-2006-0109627 A | 10/2006 |
| KR | 10-0635903 B1 | 10/2006 |
| KR | 10-0645719 B1 | 11/2006 |
| KR | 10-0646160 B1 | 11/2006 |
| KR | 10-0687007 B1 | 2/2007 |
| KR | 10-2007-0025164 A | 3/2007 |
| KR | 10-0696547 B1 | 3/2007 |
| KR | 10-0697663 B1 | 3/2007 |

(56) References Cited

FOREIGN PATENT DOCUMENTS

| | | |
|---|---|---|
| KR | 10-0698033 B1 | 3/2007 |
| KR | 10-0700466 B1 | 3/2007 |
| KR | 10-2007-0035796 A | 4/2007 |
| KR | 10-0711885 B1 | 4/2007 |
| KR | 10-2007-0050793 A | 5/2007 |
| KR | 10-0723627 B1 | 6/2007 |
| KR | 10-0726132 B1 | 6/2007 |
| KR | 10-0739309 B1 | 7/2007 |
| KR | 10-2007-0078713 A | 8/2007 |
| KR | 10-2007-0080635 A | 8/2007 |
| KR | 10-2007-0101842 A | 10/2007 |
| KR | 10-2007-0105595 A | 10/2007 |
| KR | 10-0770653 B1 | 10/2007 |
| KR | 10-2007-0112668 A | 11/2007 |
| KR | 10-2008-0001184 A | 1/2008 |
| KR | 10-0797787 B1 | 1/2008 |
| KR | 10-0800125 B1 | 1/2008 |
| KR | 10-0815265 B1 | 3/2008 |
| KR | 10-0823508 B1 | 4/2008 |
| KR | 10-2008-0044775 A | 5/2008 |
| KR | 10-0827760 B1 | 5/2008 |
| KR | 10-2008-0048653 B1 | 6/2008 |
| KR | 10-0839380 B1 | 6/2008 |
| KR | 10-2008-0060400 A | 7/2008 |
| KR | 10-2008-0061132 A | 7/2008 |
| KR | 10-2008-0062212 A | 7/2008 |
| KR | 10-2008-0109559 A | 12/2008 |
| KR | 10-2009-0038733 A | 4/2009 |
| KR | 10-2009-0040618 A | 4/2009 |
| KR | 10-2009-0052155 A | 5/2009 |
| KR | 10-2009-0053417 A | 5/2009 |
| KR | 10-0908232 B1 | 7/2009 |
| KR | 10-2009-0093161 A | 9/2009 |
| KR | 10-2009-0097453 A | 9/2009 |
| KR | 10-2010-0000128 A | 1/2010 |
| KR | 10-2010-0000129 A | 1/2010 |
| KR | 10-2010-0026655 A | 3/2010 |
| KR | 10-2010-0047796 A | 5/2010 |
| KR | 10-2010-0090070 A | 8/2010 |
| KR | 10-2011-010767 A | 9/2011 |
| WO | WO 99/025894 | 5/1999 |

OTHER PUBLICATIONS

Machine English Translation for JP-2003-003250 A, dated Jan. 8, 2003 listed above.
Japanese Office Action, dated Aug. 21, 2012, corresponding to JP 2010-145075.
Japanese Office Action, dated Sep. 4, 2012, corresponding to JP 2010-152846.
Korean Office Notice of Allowance, dated Sep. 1, 2012, corresponding to KR 10-2010-0013848.
Korean Office Notice of Allowance, dated Sep. 1, 2012, corresponding to KR 10-2010-0009160.
Korean Office Action, dated Sep. 1, 2012, corresponding to KR 10-2010-0010136.
Korean Office Action, dated Feb. 1, 2012, corresponding to KR 10-2010-0011196.
Korean Office Action, dated Feb. 1, 2012, corresponding to KR 10-2010-0013848.
Korean Office Action dated Jan. 13, 2012, for Korean Patent application 10-2009-0056529.
Korean Office Notice of Allowance dated Apr. 30, 2012, for Korean Patent application 10-2010-0066992.
Korean Office Notice of Allowance dated Jul. 20, 2012, for Korean Patent application 10-2010-0003545.
Korean Office Notice of Allowance dated Sep. 28, 2012, for Korean Patent application 10-2009-0052357.
Korean Office Notice of Allowance dated Nov. 25, 2012, for Korean Patent application 10-2010-0014277.
Korean Patent Abstract, Publication No. 10-0257219 B1, dated Feb. 29, 2000 for corresponding Korean Patent 10-1997-0054303 listed above.
Korean Patent Abstract, Publication No. 10-2002-0086047 A, dated Nov. 18, 2002 for corresponding Korean Patent 10-0405080 listed above.
Korean Patent Abstract, Publication No. 10-2002-0088662 A, dated Nov. 29, 2002 for corresponding Korean Patent 10-0463212 listed above.
Korean Patent Abstract, Publication No. 10-2005-0045619 A, dated May 17, 2005 for corresponding Korean Patent 10-0520159 listed above.
Korean Patent Abstract, Publication No. 10-2004-0062203 A, dated Jul. 7, 2004 for corresponding Korean Patent 10-0646160 listed above.
Korean Patent Abstract, Publication No. 10-2006-0101987 A, dated Sep. 27, 2006 for corresponding Korean Patent 10-0687007 listed above.
Korean Patent Abstract, Publication No. 10-2002-0056238 A, dated Jul. 10, 2002 for corresponding Korean Patent 10-0698033 listed above.
Korean Patent Abstract, Publication No. 10-2005-0078637 A, dated Aug. 5, 2005 for corresponding Korean Patent 10-0700466 listed above.
Korean Patent Abstract, Publication No. 10-2007-0025164 A, dated Mar. 8, 2007 for corresponding Korean Patent 10-0711885 listed above.
Korean Patent Abstract, Publication No. 10-2002-0034272 A, dated May 9, 2002 for corresponding Korean Patent 10-0726132 listed above.
Korean Patent Abstract, Publication No. 10-2006-0126267 A, dated Dec. 7, 2006 for corresponding Korean Patent 10-0797787 listed above.
Korean Patent Abstract, Publication No. 2008-0002189 A, dated Jan. 4, 2008 for corresponding Korean Patent 10-0800125 listed above.
Korean Patent Abstract, Publication No. 10-2007-0050793, dated May 16, 2007 for corresponding Korean Patent 10-0815265 listed above.
Korean Patent Abstract, Publication No. 10-2001-0062735 A, dated Jul. 7, 2001 for corresponding Korean Patent 10-0827760 listed above.
Korean Patent Abstract, Publication No. 10-2008-0038650, dated Jul. 5, 2008 for corresponding Korean Patent 10-0839380 listed above.
U.S. Notice of Allowance, dated Mar. 18, 2013, corresponding to U.S. Appl. No. 12/795,001.
U.S. Office action dated Feb. 26, 2013, corresponding to U.S. Appl. No. 12/794,093.
U.S. Office action dated Mar. 18, 2013, corresponding to U.S. Appl. No. 12/984,231.
U.S. Office action dated Mar. 19, 2013, corresponding to U.S. Appl. No. 13/194,759.
U.S. Office action dated Mar. 22, 2013, corresponding to U.S. Appl. No. 12/987,569.
U.S. Office action dated May 7, 2013, corresponding to U.S. Appl. No. 12/820,270.
U.S. Office action dated Dec. 20, 2013, corresponding to U.S. Appl. No. 12/984,289.

* cited by examiner

DEPOSITION APPARATUS, METHOD OF MANUFACTURING ORGANIC LIGHT EMITTING DISPLAY APPARATUS, AND ORGANIC LIGHT EMITTING DISPLAY APPARATUS

CROSS-REFERENCE TO RELATED APPLICATION

This application claims priority to and the benefit of Korean Patent Application No. 10-2013-0034691, filed on Mar. 29, 2013, in the Korean Intellectual Property Office, the entire content of which is incorporated herein by reference.

BACKGROUND

1. Field

Aspects of the present invention relate to a deposition apparatus, a method of manufacturing an organic light emitting display apparatus, and an organic light emitting display apparatus.

2. Description of the Related Art

Electronic devices including display apparatuses may include a plurality of thin films. Here, various thin films may be formed by deposition processes.

In particular, a mask having a set or predetermined pattern may be used to form a deposition layer in a desired pattern. However, it is not easy to precisely align such a mask and a substrate, and thus, there is a limitation in improving characteristics of deposition layers.

Meanwhile, display apparatuses have been replaced with thin flat panel display apparatuses that may be portable. Among the flat panel display apparatuses, organic light emitting display apparatuses are self-emissive display apparatuses that are considered as next generation display apparatuses due to their wide viewing angles, high contrast, and fast response speeds.

An organic light emitting display apparatus includes an intermediate layer, a first electrode, and a second electrode. The intermediate layer includes an organic emission layer, and when a voltage is applied to the first and second electrodes, the organic emission layer emits visible rays.

An intermediate layer and other thin films in an organic light emitting display apparatus may be formed by using a deposition process. In order to form a certain pattern on a substrate using the deposition process, a deposition mask is generally used.

It is not easy to form a fine and precise pattern through the deposition process using the deposition mask. In particular, as organic light emitting display apparatuses become larger, it is not easy to align a substrate and a deposition mask with each other precisely, and thus, it is difficult to control a precise pattern of the deposition layer.

That is, there is a limitation in improving characteristics of a deposition layer in an organic light emitting display apparatus.

SUMMARY

According to aspects of embodiments of the present invention, a deposition apparatus is capable of improving characteristics of a deposition layer, and a method of manufacturing an organic light emitting display apparatus, and an organic light emitting display apparatus are provided.

According to an embodiment of the present invention, a deposition apparatus for depositing a deposition material on a substrate includes: a deposition source facing the substrate and configured to eject the deposition material; a patterning slit sheet facing the substrate and comprising patterning slits for depositing the deposition material in a desired pattern; a frame coupled to the patterning slit sheet; and a stage bonded to the frame to support the frame, wherein a separation area is formed between the frame and the stage.

The separation area may be formed between the frame and the stage to be adjacent to a bonded region of the frame and the stage.

The frame and the stage may be bonded to each other by a plurality of bonding members, and the separation area may be a space formed by the plurality of bonding members between the frame and the stage.

Each of the bonding members may be formed as a sphere.

Each of the bonding members may be a welding ball.

The separation area may be formed as a groove in a surface of the frame, which is adjacent to a surface bonded to the stage.

The separation area may be formed as a groove in a surface of the stage, which is adjacent to a surface bonded to the frame.

The stage may operate the patterning slit sheet to be aligned with respect to the substrate in a state of being coupled to the frame.

The stage may include: a first stage configured to move the patterning slit sheet in a first direction and a second direction crossing the first direction; and a second stage on the first stage to be bonded to the frame for moving the patterning slit sheet in a third direction that is perpendicular to the first and second directions.

One or more impurities may be disposed in the separation area.

The deposition apparatus may further include a shielding member disposed between the deposition source and the patterning slit sheet, wherein the shielding member is formed to block at least a part of the substrate and is moved with the substrate.

The deposition apparatus may further include a deposition source nozzle unit disposed at a side of the deposition source, and including a plurality of deposition source nozzles.

The patterning slit sheet may be less than the substrate in at least one direction.

A plurality of deposition source nozzles may be formed in the deposition source nozzle unit in the first direction, the patterning slit sheet may include a plurality of patterning slits arranged in the first direction, and the deposition apparatus may further include a barrier plate assembly including a plurality of barrier plates that are arranged in the first direction between the deposition source nozzle unit and the patterning slit sheet so as to partition a space between the deposition source nozzle unit and the patterning slit sheet into a plurality of deposition spaces.

Each of the plurality of barrier plates may extend in the second direction that is substantially perpendicular to the first direction.

The barrier plate assembly may include a first barrier plate assembly including a plurality of first barrier plates, and a second barrier plate assembly including a plurality of second barrier plates.

Each of the plurality of the first barrier plates and each of the plurality of the second barrier plates may be formed in the second direction that is substantially perpendicular to the first direction so as to partition the space between the deposition source nozzle unit and the patterning slit sheet into a plurality of deposition spaces.

The deposition source nozzle unit may include a plurality of deposition source nozzles in the first direction, and the patterning slit sheet may include a plurality of patterning slits arranged in the second direction that is perpendicular to the first direction.

The deposition apparatus may further include: a conveyor unit including a transfer unit, on which the substrate is fixed, configured to move as the substrate is fixed thereon, the conveyor unit includes a first conveyor unit conveying the transfer unit in the first direction, and a second conveyor unit conveying the transfer unit, from which the substrate is removed after a deposition process has finished, to an opposite direction of the first direction; a loading unit configured to fix the substrate on the transfer unit; and an unloading unit configured to separate the substrate, on which the deposition process has been performed, from the transfer unit, wherein the transfer unit may be configured to circulate between the first conveyor unit and the second conveyor unit, and the substrate fixed on the transfer unit is separated from the patterning slit sheet while the transfer unit is conveyed by the first conveyor unit.

The first conveyor unit and the second conveyor unit may be arranged above and under each other.

The deposition apparatus may include a chamber and a plurality of deposition assemblies, the plurality of deposition assemblies may be arranged in the chamber between the loading unit and the unloading unit, and each of the deposition assemblies may include the deposition source, the patterning slit sheet, the frame and the stage.

The first conveyor unit and the second conveyor unit may be disposed in the chamber to pass through the plurality of deposition assemblies.

The first conveyor unit may convey the transfer unit sequentially to the loading unit, the deposition assembly, and the unloading unit.

The second conveyor unit may convey the transfer unit sequentially to the unloading unit, the deposition assembly, and the loading unit.

The deposition apparatus may further include a camera for detecting a relative location of the substrate with respect to the patterning slit sheet.

The deposition apparatus may further include a sensor for measuring a gap between the substrate and the patterning slit sheet.

According to another embodiment of the present invention, there is provided a method of manufacturing an organic light emitting display apparatus by using a deposition apparatus, the method including: fixing a substrate on a transfer unit in a loading unit; conveying the transfer unit on which the substrate is fixed into a chamber via a first conveyor unit that is installed to pass through the chamber; forming a deposition layer by depositing a deposition material ejected from a deposition assembly on the substrate while one of the substrate or the deposition assembly moves relative to the other in a state where the deposition assembly disposed in the chamber and the substrate are separated by a gap from each other; separating the substrate on which the deposition process is performed from the transfer unit in an unloading unit; and conveying the transfer unit, from which the substrate is separated, to the loading unit via a second conveyor unit that is configured to pass through the chamber, wherein the deposition assembly may include a deposition source, a patterning slit sheet, a frame coupled to the patterning slit sheet, and a stage bonded to the frame, and the substrate and the patterning slit sheet are aligned with each other by using the stage, wherein a separation area may be formed between the frame and the stage.

The deposition apparatus may include a plurality of the deposition assemblies, and the deposition is performed successively on the substrate while the substrate passes through the plurality of deposition assemblies, and each of the deposition assemblies may include the deposition source, the patterning slit sheet, the frame and the stage.

Each of the plurality of deposition assemblies may eject a deposition material separately from each other.

The transfer unit may circulate between the first conveyor unit and the second conveyor unit.

The transfer unit may be conveyed in the chamber in a non-contact manner with the first conveyor unit.

According to another aspect of the present invention, there is provided an organic light emitting display apparatus including: a substrate; a first electrode on the substrate; an intermediate layer on the first electrode and comprising an organic layer including at least an organic emission layer; and a second electrode on the intermediate layer, wherein at least one layer formed on the substrate may be formed by a deposition process and has a structure in which a hypotenuse farther from a center of a deposition space is larger than a hypotenuse closer to the center of the deposition space.

The deposition layer formed by the deposition process on the substrate may have a linear pattern.

A plurality of the deposition layers that are separated from each other may be formed on the substrate by the deposition process, and as the deposition layer from among the plurality of the deposition layers may be apart from the center of the deposition space, the hypotenuse of a side far from the center of the deposition space increases gradually.

A plurality of the deposition layers separated from each other may be formed on the substrate by the deposition process, and the deposition layer disposed at a center in the plurality of deposition layers may have hypotenuses at opposite sides, which are substantially the same as each other.

A plurality of the deposition layers separated from each other may be formed on the substrate by the deposition process, and the plurality of deposition layers may be symmetrically disposed based on the center of the deposition space.

The substrate may have a size of 40 inches or greater.

The deposition layer may have a non-uniform thickness.

The deposition layer may include at least an organic emission layer.

BRIEF DESCRIPTION OF THE DRAWINGS

The above and other features and advantages of the present invention will become more apparent by describing in more detail some example embodiments thereof with reference to the attached drawings in which.

DETAILED DESCRIPTION

Hereinafter, some embodiments of the present invention will be described in more detail with reference to accompanying drawings; however, embodiments of the present invention may be embodied in different forms and should not be construed as limited to the embodiments set forth herein. As those skilled in the art would realize, the described embodiments may be modified in various different ways, all without departing from the spirit or scope of the present invention. Accordingly, the drawings and description are to be regarded as illustrative in nature and not restrictive. Expressions such as "at least one of," when preceding a list of elements, modify the entire list of elements and do not modify the individual elements of the list.

Figure 1:
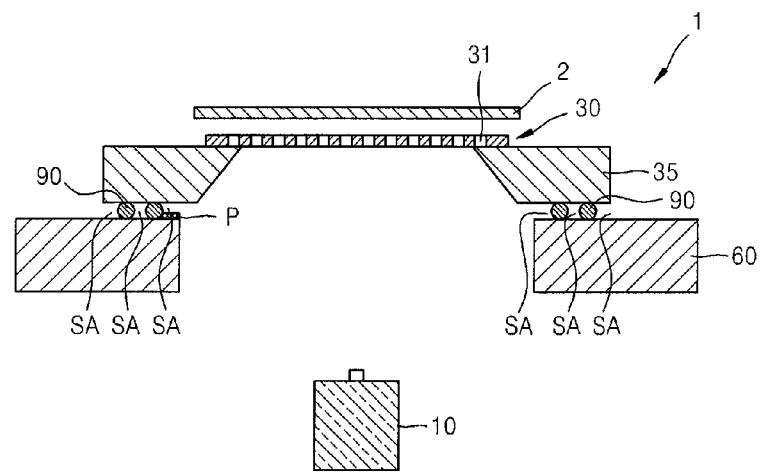
FIG. 1 is a cross-sectional view of a deposition apparatus according to an embodiment of the present invention.

FIG. 1 is a cross-sectional view of a deposition apparatus according to an embodiment of the present invention.

The deposition apparatus 1 includes a deposition source 10, a patterning slit sheet 30, a frame 35, and a stage 60.

The deposition apparatus 1 is disposed to face a substrate 2 in order to deposit a deposition material on the substrate 2. Also, although not shown in FIG. 1, the deposition apparatus 1 may include a chamber so as to provide a desired pressure environment and cleanness to a deposition processing area where the deposition process is performed.

The deposition source 10 receives one or more deposition materials and evaporates the deposition materials to transfer to the substrate 2.

The patterning slit sheet 30 is disposed to face the substrate 2. The patterning slit sheet 30 includes one or more slits 31. The patterning slit sheet 30 is disposed between the substrate 2 and the deposition source 10 so that the deposition material evaporated from the deposition source 10 reaches the substrate 2 to form a deposition layer by passing through the slits 31 of the patterning slit sheet 30.

The frame 35 is disposed to support the patterning slit sheet 30. Although not shown in FIG. 1, the frame 35 may be formed as a grating such as a window frame, and may be bonded to the patterning slit sheet 30 by using a welding method, for example, in order to be stably coupled to the patterning slit sheet 30.

The stage 60 is bonded to the frame 35. The stage 60 supports the frame 35.

Also, the stage 60 may move in one, two, or three-dimensional way, and as such, the patterning slit sheet 30 is aligned with respect to the substrate 2. That is, the stage 60 includes one or more actuators so that the stage 60 may move relative to the substrate 2.

A separation area (SA) is formed between the stage 60 and the frame 35.

In particular, the stage 60 and the frame 35 are bonded to each other by a plurality of bonding members 90. The bonding members 90 may be formed as spheres. For example, each of the bonding members 90 may be a welding ball for bonding the stage 60 and the frame 35 to each other. Also, the bonding members 90 may be formed of various materials, that is, various kinds of materials for bonding the stage 60 and the frame 35 to each other.

The separation area SA is formed between the stage 60 and the frame 35, and more specifically, the separation area SA corresponds to the space formed by the plurality of bonding members 90 between the stage 60 and the frame 35. A plurality of separation areas SAs may be formed, for example, between the adjacent bonding members 90 and around the bonding members 90 located at edges.

For forming the separation areas SA, the bonding members 90, in one embodiment, are formed such that the stage 60 and the frame 35 point-contact each other, not surface-contact each other. To do this, the bonding member 90 may be formed to have angular shapes, in addition to the spherical shapes described above.

Impurities P generated when bonding the stage 60 and the frame 35 to each other may be disposed in the separation area SA.

If the stage 60 and the frame 35 surface-contact each other, not point-contact, when the impurities P are disposed on the bonding surface, flatness of the frame 35 may not be maintained, and accordingly, the flatness of the patterning slit sheet 30 may not maintained. Consequently, aligning characteristics between the substrate 2 and the patterning slit sheet 30 are degraded, and thus, it is not easy to form a desired deposition layer evenly.

However, in the present embodiment, even when the impurities P are generated, the impurities P are disposed on the separation areas SA so as not to affect the bonding characteristics between the stage 60 and the frame 35. That is, the flatness of the frame 35 and the flatness of the patterning slit sheet 30 may be maintained easily, and, as such, a desired deposition layer may be patterned on the substrate 2.

In particular, in the deposition apparatus 1 of the present embodiment, the separation spaces SA may be formed easily by disposing the bonding members 90 for point-contacting the stage 60 and the frame 35 to each other. Thus, degradation of the flatness of the frame 35 caused by the impurities P may be prevented or substantially prevented without performing an additional process.

Figure 2:
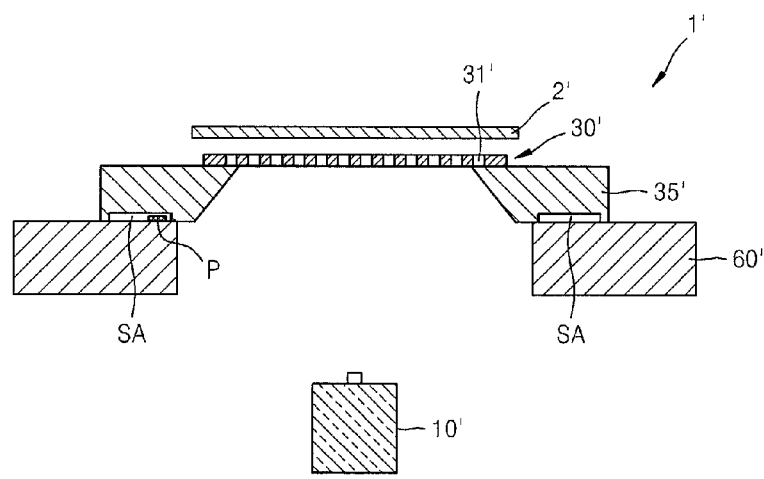
FIG. 2 is a schematic cross-sectional view of a deposition apparatus according to another embodiment of the present invention.

FIG. 2 is a cross-sectional view of a deposition apparatus 1' according to another embodiment of the present invention.

The deposition apparatus 1' includes a deposition source 10', a patterning slit sheet 30', a frame 35', and a stage 60'.

The deposition source 10' receives one or more deposition materials and evaporates the deposition materials to transfer to the substrate 2'.

The patterning slit sheet 30' is disposed to face the substrate 2'. The patterning slit sheet 30' includes one or more slits 31'. The patterning slit sheet 30' is disposed between the substrate 2' and the deposition source 10' so that the deposition material evaporated from the deposition source 10' reaches the substrate 2' to form a deposition layer by passing through the slits 31' of the patterning slit sheet 30'.

The frame 35' is disposed to support the patterning slit sheet 30'. Although not shown in FIG. 2, the frame 35' may be formed as a grating such as a window frame, and may be bonded to the patterning slit sheet 30' by using a welding method, for example, in order to be stably coupled to the patterning slit sheet 30'.

The stage 60' is bonded to the frame 35'. The stage 60' supports the frame 35'. Also, the stage 60' may move in a one, two, or three-dimensional manner, and as such, the patterning slit sheet 30' is aligned with respect to the substrate 2'. That is, the stage 60' includes one or more actuators such that the stage 60' may move relative to the substrate 2'.

A separation area SA is formed between the stage 60' and the frame 35'. In more detail, the separation area SA formed as a groove is formed on a surface of the frame 35', which is bonded to the stage 60', that is, a lower surface of the frame 35'. That is, as shown in FIG. 2, the separation area SA is formed as a groove by removing a set or predetermined thickness of the frame 35' so as to be adjacent to the portion of the frame 35', which is bonded to the stage 60'.

Since the separation area SA is formed as the groove in the lower surface of the frame 35', the frame 35' and the stage 60' may be bonded to each other in a line-contacting way or a surface-contacting way less a set or predetermined area.

The impurities P that may be generated when bonding the stage 60' and the frame 35' to each other may be disposed in the separation area SA.

In the present embodiment, even when the impurities P are generated, the impurities P may be disposed in the separation area SA so as not to affect the bonding characteristics of the stage 60' and the frame 35'. That is, flatness of the frame 35' and flatness of the patterning slit sheet 30' may be maintained easily, and thus, a desired deposition layer may be patterned on the substrate 2' easily.

In particular, since the separation area SA formed as the groove is formed in the lower surface of the frame 35' in the deposition apparatus 1' of the present embodiment, degradation of the flatness of the frame 35' that may be caused by the impurities P may be prevented or substantially prevented without performing an additional process.

Figure 3:
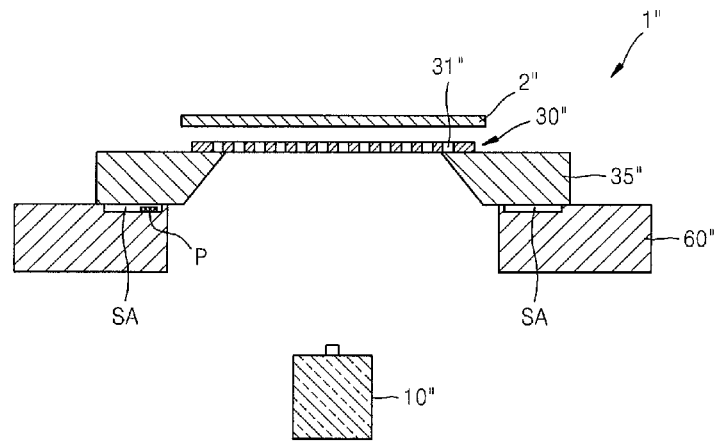
FIG. 3 is a schematic cross-sectional view of a deposition apparatus according to another embodiment of the present invention.

FIG. 3 is a cross-sectional view of a deposition apparatus 1" according to another embodiment of the present invention.

The deposition apparatus 1" includes a deposition source 10", a patterning slit sheet 30", a frame 35", and a stage 60".

The deposition source 10" receives one or more deposition materials and evaporates the deposition materials to transfer to the substrate 2".

The patterning slit sheet 30" is disposed to face the substrate 2". The patterning slit sheet 30" includes one or more slits 31". The patterning slit sheet 30" is disposed between the substrate 2" and the deposition source 10" so that the deposition material evaporated from the deposition source 10" reaches the substrate 2" to form a deposition layer by passing through the slits 31" of the patterning slit sheet 30".

The frame 35" is disposed to support the patterning slit sheet 30". Although not shown in FIG. 3, the frame 35" may be formed as a grating such as a window frame, and may be bonded to the patterning slit sheet 30" by using a welding method, for example, in order to be stably coupled to the patterning slit sheet 30".

The stage 60" is bonded to the frame 35". The stage 60" supports the frame 35". Also, the stage 60" may move in one, two, or three-dimensional way, and, as such, the patterning slit sheet 30" is aligned with respect to the substrate 2". That is, the stage 60" includes one or more actuators such that the stage 60" may move relative to the substrate 2".

The separation area SA is formed between the stage 60" and the frame 35". In particular, the separation area is formed as a groove in a surface of the stage 60", that is, an upper surface of the stage 60", which is bonded to the frame 35". As shown in FIG. 3, the separation area SA formed as the groove is formed by removing a set or predetermined thickness of the stage 60" in the upper surface of the stage 60" to be adjacent to the bonded portion to the frame 35".

Since the separation area SA is formed as the groove in the upper surface of the stage 60", the frame 35" and the stage 60" may be bonded to each other in a line-contacting way or a surface-contacting way less a set or predetermined area.

The impurities P that may be generated when bonding the stage 60" and the frame 35" to each other may be disposed in the separation area SA.

In the present embodiment, even when the impurities P are generated, the impurities P may be disposed in the separation area SA so as not to affect the bonding characteristics of the stage 60" and the frame 35". That is, flatness of the frame 35" and flatness of the patterning slit sheet 30" may be maintained easily, and thus, a desired deposition layer may be patterned on the substrate 2" easily.

In particular, since the separation area SA formed as the groove is formed in the upper surface of the stage 60" in the deposition apparatus 1" of the present embodiment, degradation of the flatness of the frame 35" that may be caused by the impurities P may be prevented or substantially prevented easily without performing an additional process.

Referring to FIGS. 4 through 7, a deposition apparatus 1000 according to an embodiment of the present invention includes one or more deposition assemblies 100-1 through 100-11. The number of deposition assemblies included in the deposition unit 100 may be set variously.

The deposition apparatus 1000 includes a deposition unit 100, a loading unit 200, an unloading unit 300, and a conveyor unit 400.

The loading unit 200 may include a first rack 212, an introduction chamber 214, a first inversion chamber 218, and a buffer chamber 219.

A plurality of substrates 2 onto which a deposition material is not applied are stacked up on the first rack 212. A transport robot included in the introduction chamber 214 picks up one of the substrates 2 from the first rack 212, disposes it on a transfer unit 430 transferred by a second conveyor unit 420, and moves the transfer unit 430 on which the substrate 2 is disposed into the first inversion chamber 218.

The first inversion chamber 218 is disposed adjacent to the introduction chamber 214. The first inversion chamber 218 includes a first inversion robot that inverts the transfer unit 430 and then loads it into a first conveyer unit 410 of the deposition unit 100.

Figure 4:
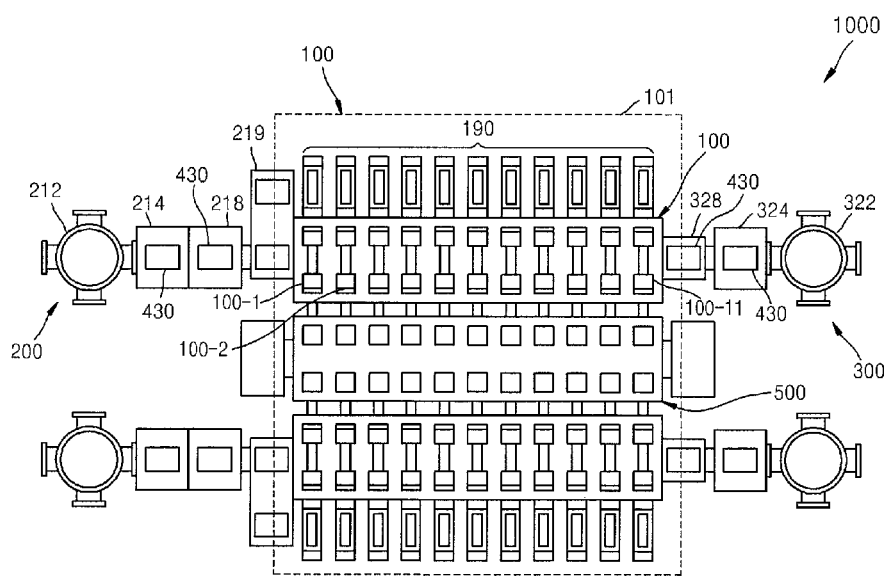
FIG. 4 is a schematic plan view showing a system configuration in a deposition apparatus according to another embodiment of the present invention.

As shown in FIG. 4, an introduction robot in the introduction chamber 214 places one of the substrates 2 on an upper surface of the transfer unit 430, and the transfer unit 430 on which the substrate 2 is disposed is loaded into the inversion chamber 218. The first inversion robot inverts the inversion chamber 218 such that the substrate 2 is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is disposed on the transfer unit 430. Then, an ejection robot removes the transfer unit 430 on which the substrate 2 is disposed from the ejection chamber 324, separates the substrate 2 from the transfer unit 430, and then loads the substrate 2 into the second rack 322. The transfer unit 430 separated from the substrate 2 is returned back into the loading unit 200 via the second conveyer unit 420.

However, the present invention is not limited to the above description. For example, when disposing the substrate 2 on the transfer unit 430, the substrate 2 may be fixed onto a bottom surface of the transfer unit 430 and then moved into the deposition unit 100. In this case, for example, the first inversion chamber 218 and the first inversion robot, and the second inversion chamber 328 and the second inversion robot are not required.

The deposition unit 100 may include at least one deposition chamber 101. The plurality of deposition assemblies 100-1 through 100-11 are disposed in the deposition chamber 101. The deposition chamber may be maintained in a vacuum state during a deposition process.

Meanwhile, the transfer unit 430 on which the substrate 2 is disposed may be moved at least to the deposition unit 100 or may be moved sequentially to the loading unit 200, the deposition unit 100, and the unloading unit 300, by the first conveyor unit 410. The transfer unit 430 that is separated from the substrate 2 in the unloading unit 300 is moved back to the loading unit 200 by the second conveyor unit 420.

The first conveyor unit 410 is configured to pass through the deposition chamber 101 when the transfer unit 430 passes through the deposition unit 100, and the second conveyor unit 420 is configured to convey the transfer unit 430, from which the substrate 2 is separated.

In the deposition apparatus 1000 of the present embodiment, the first conveyor unit 410 and the second conveyor unit 420 are formed above and under each other so that the transfer unit 430 on which the deposition process is finished while passing through the first conveyor unit 410 is separated from the substrate 2 in the unloading unit 300, and after that, is returned to the loading unit 200 via the second conveyor unit 420 formed under the first conveyor unit 410. Thus, efficiency of utilizing a space may be improved.

On the other hand, the deposition unit 100 may further include a deposition source replacement unit 190 at a side of each of the deposition assemblies 100-1 through 100-11. Although not shown in FIGS. 4 through 7, the deposition source replacement unit 190 is formed as a cassette so as to be drawn from each of the deposition assemblies 100-1 through 100-11. Therefore, changing the deposition source (refer to 110 of FIG. 6) of the deposition assembly 100-1 through 100-11 may be performed easily.

In FIG. 4, a series of two sets of structures are illustrated in the deposition apparatus 1000, each of the sets includes the loading unit 200, the deposition unit 100, the unloading unit 300, and the conveyor unit 400, are shown. That is, two sets of structures, each including the loading unit 200, the deposition unit 100, the unloading unit 300, and the conveyor unit 400, are configured in the deposition apparatus 1000 in FIG. 4; however, the present invention is not limited thereto, that is, the deposition apparatus 1000 may include only one set. Also, as another example, it may be considered that two deposition apparatuses 1000 are shown in FIG. 4.

The deposition apparatus 1000 may further include a patterning slit sheet replacement unit 500 in order to improve efficiency of space utilization.

Figure 5:
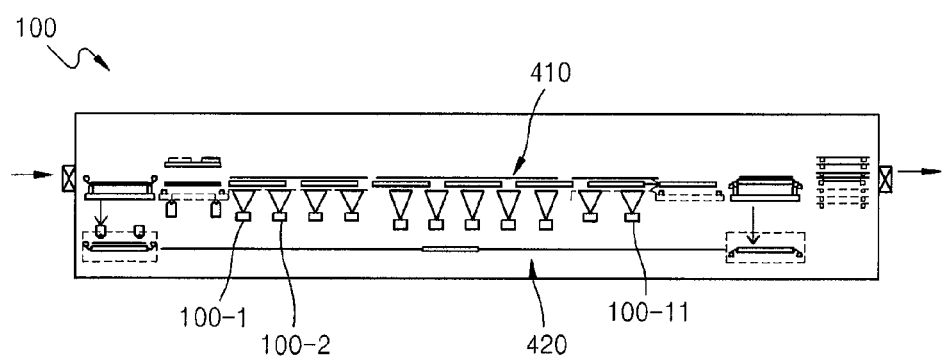
FIG. 5 is a side view of a deposition unit in the deposition apparatus of FIG. 4.
Figure 6:
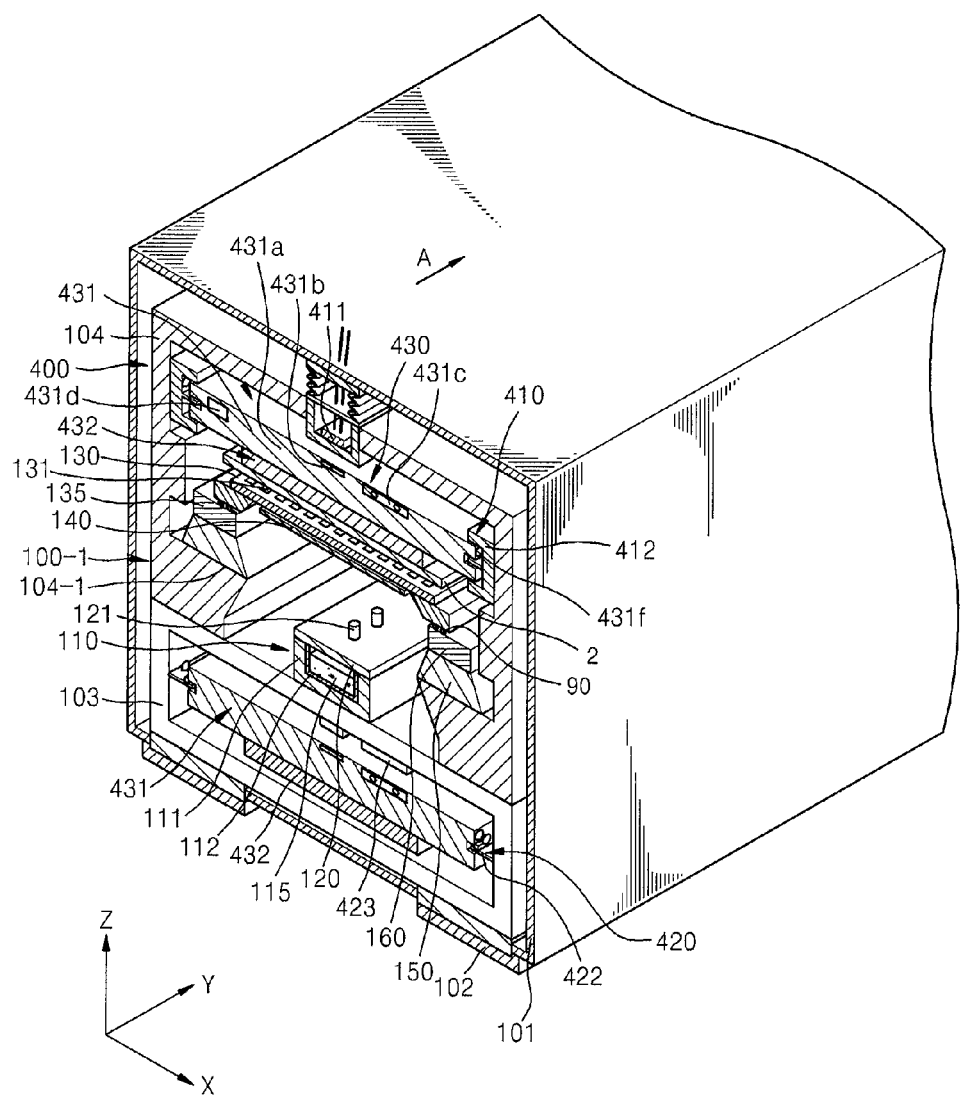
FIG. 6 is a perspective view of a deposition assembly in the deposition apparatus of FIG. 4.
Figure 7:
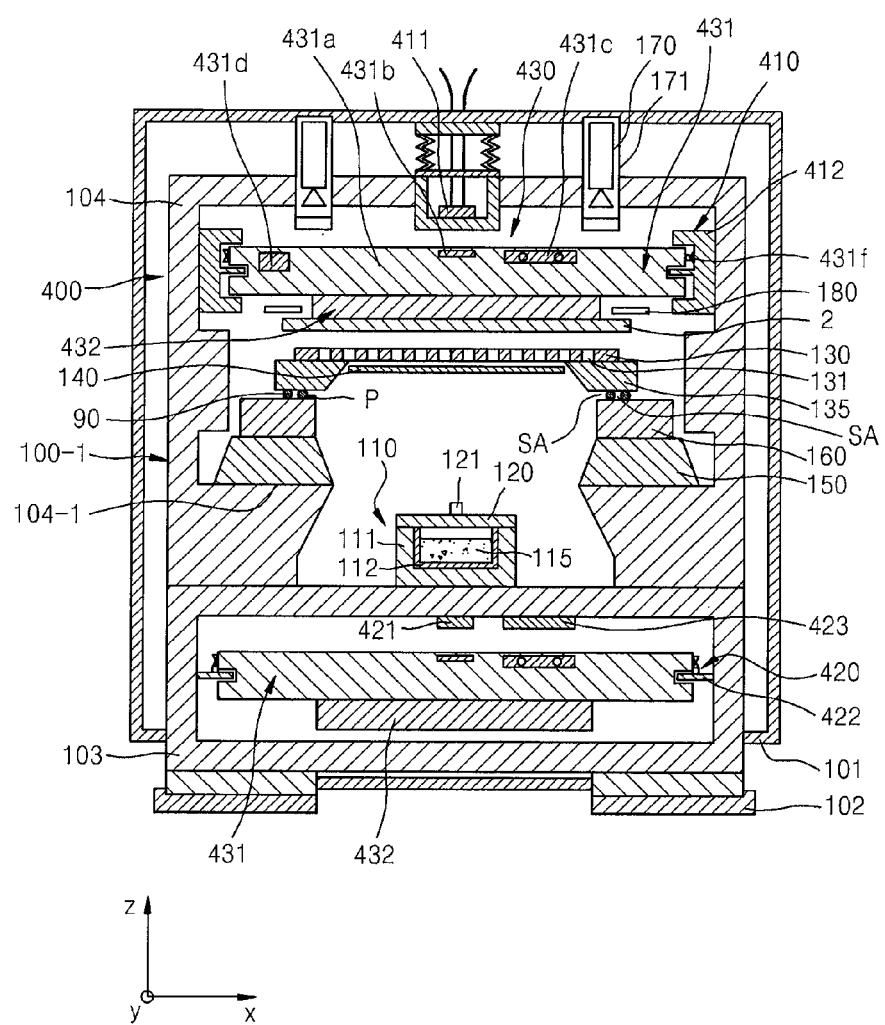
FIG. 7 is a schematic cross-sectional view of a deposition assembly shown in FIG. 4.

Also, referring to FIGS. 5 through 7, the deposition unit 100 in the deposition apparatus 1000 of the present embodiment may include one or more deposition assemblies 100-1 through 100-11, and the conveyor unit 400.

Hereinafter, configuration of the deposition unit 100 will be described below.

The chamber 101 is formed as a hollow box, in which one or more deposition assemblies 100-1 and the conveyor unit 400 are accommodated. From another point of view, feet 102 are formed to be fixed on ground, a lower housing 103 is formed on the feet 102, and an upper housing 104 is formed on the lower housing 103. In addition, the chamber 101 is formed to accommodate the lower housing 103 and the upper housing 104 therein. Here, a connecting portion between the lower housing 103 and the chamber 101 is sealed so that inside the chamber 101 may be completely shielded from outside. As described above, since the lower housing 103 and the upper housing 104 are formed on the feet 102 that are fixed on the ground, the lower housing 103 and the upper housing 104 may be maintained at fixed locations even when the chamber 101 repeatedly expands and reduces, and accordingly, the lower housing 103 and the upper housing 104 may serve as reference frames in the deposition unit 100.

Meanwhile, the deposition assembly 100-1 and the first conveyor unit 410 of the conveyor unit 400 are formed in the upper housing 104, and the second conveyor unit 420 of the conveyor unit 400 is formed in the lower housing 103. In addition, the transfer unit 430 circulates between the first and second conveyor units 410 and 420 to perform the deposition process successively.

A configuration of the deposition assembly 100-1 is described further below. Each deposition assembly 100-1 may include a deposition source 110, a deposition source nozzle unit 120, a patterning slit sheet 130, a shielding member 140, a first stage 150, a second stage 160, a camera 170, and a sensor 180. Here, all the components of the deposition assembly 100-1 shown in FIGS. 6 and 7 may be disposed within the chamber 101 that is maintained at an appropriate degree of vacuum in order to allow a deposition material to move in a substantially straight line through the deposition assembly 100-1.

In more detail, in order to deposit a deposition material 115 that is emitted from a deposition source 110 and is discharged through the deposition source nozzle unit 120 and the patterning slit sheet 130, onto the substrate 2 in a desired pattern, it is required to maintain the chamber in a high-vacuum state as in a deposition method using a fine metal mask (FMM). In addition, the temperature of the patterning slit sheet 130 have to be sufficiently lower than the temperature of the deposition source 110. The temperature of the patterning slit sheet 130 should be sufficiently low so as to reduce thermal expansion of the patterning slit sheet 130.

The substrate 2, which constitutes a target on which a deposition material 115 is to be deposited, is disposed in the chamber 101. The substrate 2 may be a substrate for flat panel displays. A large substrate of 40 inches or greater, such as a mother glass, for manufacturing a plurality of flat panel displays, may be used as the substrate 2.

In one or more embodiments of the present invention, deposition may be performed while the substrate 2 or the deposition assembly 100-1 is moved relative to each other.

In particular, in the comparable FMM deposition method, the size of the FMM has to be equal to the size of a substrate. Thus, the size of the FMM has to be increased as the substrate becomes larger. However, it is not straightforward to either manufacture a large FMM or to extend an FMM to be accurately aligned with a pattern.

In order to overcome this problem, in the deposition assembly 100-1 according to one or more embodiments of the present invention, deposition may be performed while the deposition assembly 100-1 or the substrate 2 is moved relative to each other. In other words, deposition may be continuously performed while the substrate 2, which is disposed such as to face the deposition assembly 100-1, is moved in a Y-axis direction. In other words, deposition is performed in a scanning manner while the substrate 2 is moved in a direction of arrow A in FIG. 6. Although the substrate 2 is illustrated as being moved in the Y-axis direction in FIG. 6 when deposition is performed, the present invention is not limited thereto. Deposition may be performed while the deposition assembly 100-1 is moved in the Y-axis direction, whereas the substrate 2 is fixed.

Thus, in the deposition assembly 100-1 according to the current embodiment of the present invention, the patterning slit sheet 130 may be significantly smaller than an FMM used in a comparable deposition method. In other words, in the deposition assembly 100-1 according to the current embodiment of the present invention, deposition is continuously performed, i.e., in a scanning manner while the substrate 2 is moved in the Y-axis direction. Thus, lengths of the patterning slit sheet 130 in the X-axis and Y-axis directions may be significantly less than the lengths of the substrate 2 in the X-axis and Y-axis directions. As described above, since the patterning slit sheet 130 may be formed to be significantly smaller than an FMM used in a comparable deposition method, it is relatively easy to manufacture the patterning slit sheet 130 used in the present invention. In other words, using the patterning slit sheet 130, which is smaller than an FMM used in a comparable deposition method, is more convenient in all processes, including etching and other subsequent processes, such as precise extension, welding, moving, and cleaning processes, compared to the comparable deposition method using the larger FMM. This is more advantageous for a relatively large display device.

In order to perform deposition while the deposition assembly 100-1 or the substrate 2 is moved relative to each other as described above, the deposition assembly 100-1 and the substrate 2 may be separated from each other by a set or predetermined distance. This will be described later in more detail.

The deposition source 110 that contains and heats the deposition material 115 is disposed in an opposite side of the chamber in which the substrate 2 is disposed. As the deposition material 115 contained in the deposition source 110 is vaporized, the deposition material 115 is deposited on the substrate 2.

The deposition source 110 includes a crucible 111 containing the deposition material 115, and a heater 112 for evaporating the deposition material 115.

The deposition source nozzle unit 120 is disposed at a side of the deposition source 110, and in particular, at the side of the deposition source 110 facing the substrate 2. Here, in the deposition assembly 100-1 of the present embodiment, deposition source nozzles for forming a common layer and a pattern layer may be formed different from each other. That is, the deposition source nozzle unit 120 includes a plurality of deposition source nozzles 121 arranged in the Y-axis direction, that is, in the scanning direction of the substrate 2. Accordingly, it may be considered that one deposition source nozzle 121 exists in the X-axis direction, and thus there is no shadow zone on the substrate 2. Although not shown in the drawings, the deposition source nozzle unit for forming the common layer may include a plurality of deposition source nozzles 121 in the X-axis direction. Accordingly, a thickness uniformity of the common layer may be improved.

The patterning slit sheet 130 and a frame 135 formed as a window frame, in which the patterning slit sheet 130 is bound, are disposed between the deposition source 110 and the substrate 2.

The patterning slit sheet 130 includes a plurality of patterning slits 131 arranged in the X-axis direction. The deposition material 115 that is vaporized in the deposition source 110, passes through the deposition source nozzle unit 120 and the patterning slit sheet 130 towards the substrate 2 that is the deposition target. The patterning slit sheet 130 may be manufactured by etching, which is the same method as used in a comparable method of manufacturing an FMM, and in particular, a striped FMM. In one embodiment, the total number of patterning slits 131 may be greater than the total number of deposition source nozzles 121.

The deposition source 110 (and the deposition source nozzle unit 120 coupled to the deposition source 110) and the patterning slit sheet 130 may be formed to be separated from each other by a set or predetermined distance.

As described above, the deposition assembly 100-1 according to the present embodiment performs deposition while being moved relative to the substrate 2. In order to move the deposition assembly 100-1 relative to the substrate 2, the patterning slit sheet 130 is separated from the substrate 2 by a set or predetermined distance.

In particular, in a comparable deposition method using an FMM, deposition is performed with the FMM in close contact with a substrate in order to prevent formation of a shadow zone on the substrate. However, when the FMM is used in close contact with the substrate, the contact may cause defects. In addition, in the comparable deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the deposition assembly 100-1 according to the present embodiment, the patterning slit sheet 130 is disposed to be separated from the substrate 2 which is the deposition target by a set or predetermined distance. That is, by performing the deposition process while moving the patterning slit sheet 130 that is smaller than the substrate 2 relative to the substrate 2, the patterning slit sheet 130 may be manufactured easily. In addition, defects caused by the contact between the substrate 2 and the patterning slit sheet 130 may be prevented, and time for adhering the substrate 2 and the patterning slit sheet 130 to each other is not necessary. Thus, manufacturing time may be reduced.

Components in the upper housing 104 may be disposed as follows.

First, the deposition source 110 and the deposition source nozzle unit 120 described above are disposed on a bottom portion of the upper housing 104. In addition, mounting units 104-1 protrude from opposite sides of the deposition source 110 and the deposition source nozzle unit 120. The first stage 150, the second stage 160, and the patterning slit sheet 130 are sequentially formed on the mounting units 104-1.

Here, the first stage 150 is configured to move in the X-axis and Y-axis directions so as to align the patterning slit sheet 130 in the X-axis direction and the Y-axis direction. That is, the first stage 150 includes a plurality of actuators so that the first stage 150 may be moved in the X-axis direction and the Y-axis direction with respect to the upper housing 104.

In addition, the second stage 160 is configured to move in a Z-axis direction so as to align the patterning slit sheet 130 in the Z-axis direction. That is, the second stage 160 includes a plurality of actuators so as to be moved in the Z-axis direction with respect to the first stage 150.

The patterning slit sheet 130 is formed on the second stage 160. As described above, since the patterning slit sheet 130 is formed on the first stage 150 and the second stage 160 so as to be moved in the X-axis, Y-axis, and Z-axis directions, the substrate 2 and the patterning slit sheet 130 may be aligned in real-time.

The second stage 160 and the frame 135 are bonded to each other by using the bonding members 90, and a separation area SA is formed between the second stage 160 and the frame 135. In addition, the impurities P may be disposed in the separation area SA. As such, the flatness of the frame 135 and the flatness of the patterning slit sheet 130 may be maintained, and thus, a desired deposition layer may be easily patterned on the substrate 2. In particular, degradation of the flatness of the patterning slit sheet 130 due to the impurities P during aligning the patterning slit sheet 130 by using the first stage 150 and the second stage 160 may be prevented or substantially prevented, and thus, accuracy of the alignment operation of the patterning slit sheet 130 via the first stage 150 and the second stage 160 may be improved.

The separation area SA of the present embodiment is similar to the separation area SA shown in FIG. 1; however, the present invention is not limited thereto. That is, the separation area SA shown in FIG. 2 or FIG. 3 may be used. Thus, the separation area SA formed as the groove may be formed in a surface of the frame 135 or the second stage 160. Detailed descriptions are not provided here.

The upper housing 104, the first stage 150, and the second stage 160 may guide proceeding path of the deposition material so that the deposition material discharged through the deposition source nozzles 121 may not be dispersed. That is, a moving passage of the deposition material is blocked by the upper housing 104, the first stage 150, and the second stage 160, so that the movement of the X-axis and the Y-axis directions may be guided at the same time.

In addition, a shielding member 140 may be further disposed between the patterning slit sheet 130 and the deposition source 110. In more detail, electrode patterns are formed on boundaries of the substrate 2 to be used as terminals when testing products or manufacturing products. If an organic material or other undesired deposition layers are formed on regions where the electrode patterns are formed, it is difficult to operate the electrode patterns normally. Therefore, boundaries of the substrate 2 have to be the regions where the organic material may not be deposited, that is, have to be non-film forming regions. However, as described above, since the deposition is performed in the scanning manner, that is, the substrate 2 moves relative to the deposition apparatus, it is not easy to perform the process so as not to form the deposition layer on the non-film forming regions of the substrate 2.

In the present embodiment, in order to prevent or substantially prevent the deposition layer from being formed on the non-film forming regions of the substrate 2, an additional shielding member 140 may be further formed to correspond to the boundaries of the substrate 2. Although not shown in FIG. 6 in detail, the shielding member 140 may include two adjacent plates.

When the substrate 2 does not pass through the deposition assembly 100-1, the shielding member 140 shields the deposition source 110 so that the deposition material 115 emitted from the deposition source 110 may not reach the patterning slit sheet 130. In this state, when the substrate 2 starts to enter the deposition assembly 100-1, the shielding member 140 blocking the deposition source 110 is moved with the movement of the substrate 2 and the proceeding passage of the deposition material 115 is opened, and thus, the deposition material 115 emitted from the deposition source 110 passes through the patterning slit sheet 130 to be deposited on the substrate 2. When the entire substrate 2 passes the deposition assembly 100-1, the shielding member 140 at the rear portion of the substrate 2 is moved with the movement of the substrate 2 to block the proceeding passage of the deposition material 115 and block the deposition source 110, and thus, the deposition material 115 emitted from the deposition source 110 may not reach the patterning slit sheet 130.

Since the non-film forming regions of the substrate 2 are blocked by the shielding member 140, deposition of the organic material on the non-film forming regions of the substrate 2 may be prevented without using an additional structure.

Hereinafter, the conveyor unit 400 for conveying the substrate 2 that is the deposition target will be described in more detail. Referring to FIGS. 6 and 7, the conveyor unit 400 includes the first conveyor unit 410, the second conveyor unit 420, and the transfer unit 430.

The first conveyor unit 410 conveys the transfer unit 430 including a carrier 431 and an electrostatic chuck 432 coupled to the carrier 431 and the substrate 2 disposed on the transfer unit 430 in-line so that a deposition layer may be formed on the substrate 2 by the deposition assembly 100-1. The first conveyor unit 410 includes a coil 411, a guide member 412, upper magnetically suspended bearings, side magnetically suspended bearings, and gap sensors.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed along the first conveyer unit 410 and the second conveyer unit 420 and the electrostatic chuck 432 that is combined on a surface of the carrier 431 and to which the substrate 2 is attached.

Hereinafter, elements of the conveyor unit 400 will be described in more detail below.

First, the carrier 431 of the transfer unit 430 will be described in more detail.

The carrier 431 includes a main body part 431a, a magnetic rail 431b, contactless power supply (CPS) modules 431c, and a power supply unit 431d. The carrier 431 may further include cam followers 431f.

The main body part 431a constitutes a base part of the carrier 431 and may be formed of a magnetic material such as iron. In this regard, due to a repulsive force between the main body part 431a and the respective upper and side magnetically suspended bearings, which are described below, the carrier 431 may be maintained spaced apart from the guide members 412 by a certain distance.

Set or predetermined guide recesses may be formed on opposite side surfaces of the main body part 431a, and guide protrusions of the guide members 412 may be received in the guide recesses. The magnetic rail 431b may be formed along a center line of the main body part 431a in a direction where the main body part 431a proceeds. The magnetic rail 431b and the coil 411 that will be described later may be combined with each other to constitute a linear motor, and the carrier 431 may be conveyed in an arrow A direction by the linear motor.

The CPS modules 431c and the power supply unit 431d may be respectively formed on both sides of the magnetic rail 431b in the main body part 431a. The power supply unit 431d is a battery for charging that provides power so that the electrostatic chuck 432 chucks the substrate 2 and maintains operation. The CPS modules 431c are a wireless charging module that charges the power supply unit 431d. In particular, the charging track 423 formed in the second conveyer unit 420, which are described below, is connected to an inverter, and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

An electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

Hereinafter, an operation of the transfer unit 430 is described in more detail.

The magnetic rail 431b of the main body part 431a and the coil 411 may be combined with each other to constitute an operation unit. In this regard, the operation unit may be a linear motor. The linear motor has a small frictional coefficient, little position error, and a very high degree of position determination, as compared to a comparable slide guide system. As described above, the linear motor may include the coil 411 and the magnetic rail 431b. The magnetic rail 431b is linearly disposed on the carrier 431, and a plurality of the coils 411 may be disposed at an inner side of the chamber 101 by a certain distance so as to face the magnetic rail 431b. Since the magnetic rail 431b is disposed on the carrier 431 instead of the coil 411, the carrier 431 may be operable without power being supplied thereto. In this regard, the coil 411 may be formed in an atmosphere (ATM) box in an air atmosphere and the carrier 431 to which the magnetic rail 431b is attached may be moved in the chamber 101 maintained in vacuum.

Hereinafter, the first conveyer unit 410 and the transfer unit 430 are described in more detail.

The first conveyer unit 410 conveys the electrostatic chuck 432 that fixes the substrate 2 and conveys the carrier 431 that conveys the electrostatic chuck 432.

The coil 411 and the guide members 412 are formed inside the upper housing 104. The coil 411 is formed in an upper portion of the upper housing 104, and the guide members 412 are respectively formed on both inner sides of the upper housing 104. The guide members 412 guide the carrier 431 to move in a direction. In this regard, the guide members 412 are formed to pass through the deposition unit 100.

The side magnetically suspended bearings are each disposed in side surfaces of the guide member 412 so as to respectively correspond to both sides of the carrier 431. The side magnetically suspended bearings cause a distance between the carrier 431 and the guide member 412 so that the carrier 431 is moved along the guide members 412 in non-contact with the guide members 412.

The upper magnetically suspended bearing may be disposed in side surfaces of the guide members 412 so as to be above the carrier 431. The upper magnetically suspended bearings enable the carrier 431 to be moved along the guide members 412 in non-contact with the guide members 412 and to maintain the gap constantly.

The guide members 412 may further include the gap sensors so as to measure a distance between the carrier 431 and the guide member 412. In addition, the magnetically suspended bearings may also include gap sensors. The gap between the carrier 431 and the guide members 412 may be adjusted in real-time according to the value measured by the gap sensors. That is, the carrier 431 may be moved finely by the feedback control using the magnetically suspended bearings and the gap sensors.

Next, the second conveyer unit 420 and the transfer unit 430 are described in more detail.

The second conveyer unit 420 returns the transfer unit 430 from which the substrate 2 has been separated in the unloading unit 300 and the carrier 431 that carries the transfer unit 430 to the loading unit 200. In this regard, the second conveyer unit 420 includes the coil 421, the roller guides 422, and the charging track 423.

In particular, the coil 421, the roller guides 422, and the charging track 423 may be positioned inside the lower housing 103. The coil 421 and the charging track 423 may be disposed on a top inner surface of the lower housing 103, and the roller guides 422 may be disposed on both inner sides of the lower housing 103. Although not illustrated in the drawings, the coil 421 may be disposed in an ATM box, as the coil 411 of the first conveyer unit 410.

Like the first conveyer unit 410, the second conveyer unit 420 may also include the coil 421, and the magnetic rail 431b of the main body part 431a of the carrier 431 and the coil 421 are combined with each other to constitute an operation unit. In this regard, the operation unit may be a linear motor. The carrier 431 may be moved by the linear motor along a direction opposite to the direction of arrow A illustrated in FIG. 6.

The roller guides 422 guide the carrier 431 to move in a direction. In this regard, the roller guides 422 are formed to pass through the deposition unit 100. In particular, the roller guides 422 support cam followers 431f respectively formed on both sides of the carrier 431 to guide the carrier 431 to move along a direction opposite to the direction of arrow A illustrated in FIG. 6. That is, the carrier 431 is moved with the cam followers 431f disposed on both sides of the carrier 431 respectively rotating along the roller guides 422. In this regard, the cam followers 431f are kinds of bearings used to accurately repeat a particular operation. In an embodiment, a plurality of the cam followers 431f are formed on a side surface of the carrier 431 and serve as a wheel for conveying the carrier 431 in the second conveyer unit 420.

Therefore, the second conveyer unit 420 is used in a process of returning the carrier 431 from which the substrate 2 has been separated and not in a process of depositing an organic material on the substrate 2, and thus, position accuracy thereof is not needed as by the first conveyer unit 410. Therefore, magnetic suspension is applied to the first conveyer unit 410 that requires high position accuracy, thereby obtaining position accuracy, and a comparable roller method is applied to the second conveyer unit 420 that requires relatively low position accuracy, thereby reducing manufacturing costs and simplifying a structure of the organic layer deposition apparatus. Although not illustrated in FIG. 6, the magnetic suspension may also be applied to the second conveyer unit 420 as in the first conveyer unit 410.

The organic layer deposition assembly 100-1 of the organic layer deposition apparatus 1000 according to the present embodiment may further include the camera 170 and the sensor 180 for an aligning process. In more detail, the camera 170 may align in real time a first alignment mark formed in the frame 135 or the patterning slit sheet 130 and a second alignment mark formed on the substrate 2. In this regard, the camera 170 is disposed to have a more accurate view in the chamber 101 maintained in vacuum during deposition. For this, the camera 170 may be installed in a camera accommodation unit 171 in an atmospheric state.

Since the substrate 2 and the patterning slit sheet 130 are spaced apart from each other by a certain distance, both distances to the substrate 2 and to the patterning slit sheet 130 that are disposed at different positions need to be measured using the camera 170. For this operation, the deposition assembly 100-1 of the deposition apparatus 1000 may include the sensor 180. In this regard, the sensor 180 may be a confocal sensor. The confocal sensor may scan an object to be measured by using laser beams that rotate at high speed by using a scanning mirror and measure a distance to the object by using fluorescent or reflected rays emitted by the laser beams. The confocal sensor may measure a distance by sensing a boundary interface between different media.

Since a distance between the substrate 2 and the patterning slit sheet 130 is measurable in real time using the camera 170 and the sensor 180, the substrate 2 may be aligned with the patterning slit sheet 130 in real time, whereby position accuracy of a pattern may be significantly improved.

Figure 8:
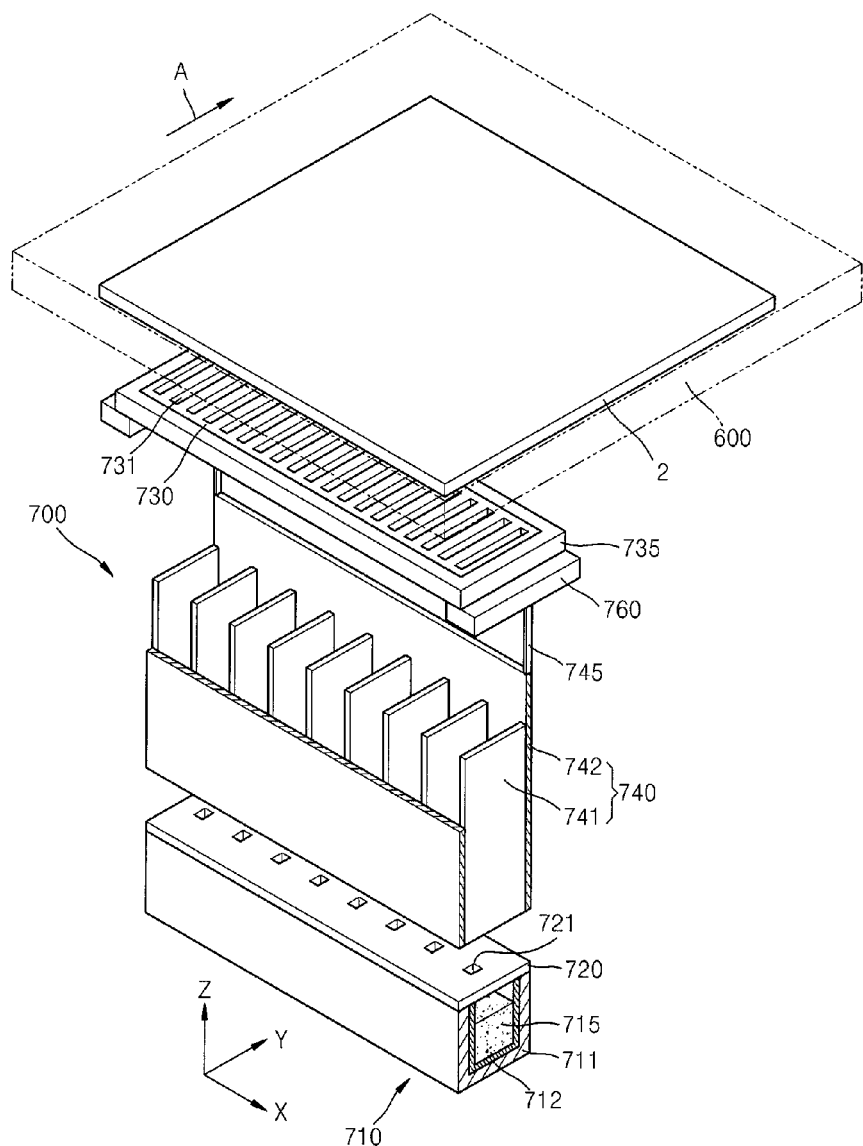
FIG. 8 is a schematic perspective view of a deposition apparatus according to another embodiment of the present invention.
Figure 9:
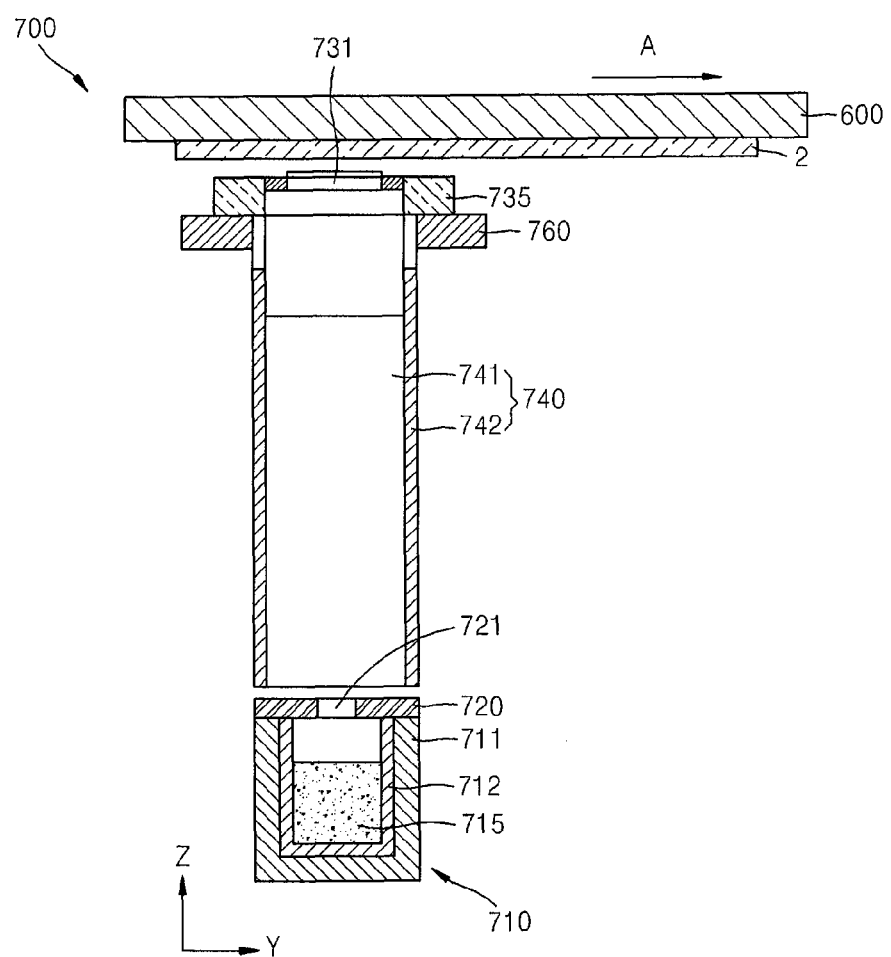
FIG. 9 is a schematic side sectional view of the deposition apparatus shown in FIG. 8.
Figure 10:
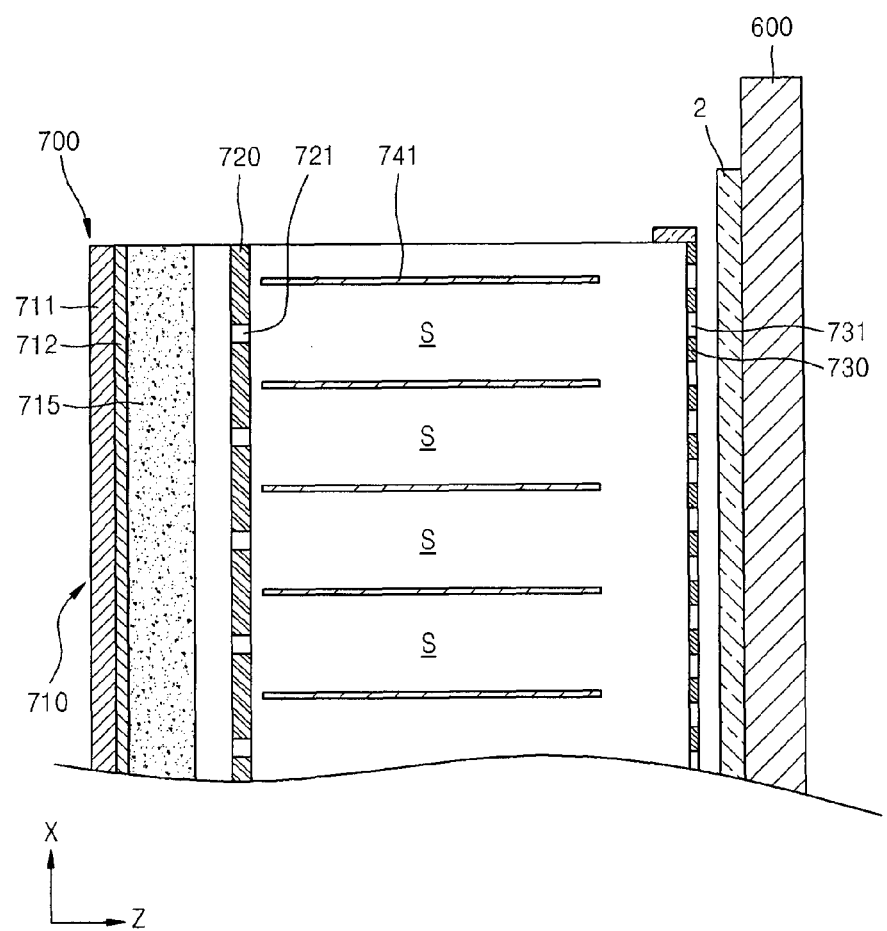
FIG. 10 is a schematic horizontal cross-sectional view of the deposition apparatus shown in FIG. 8.

FIG. 8 is a schematic perspective view of a deposition apparatus 700 according to another embodiment of the present invention, FIG. 9 is a side-sectional view of the deposition apparatus 700 shown in FIG. 8, and FIG. 10 is a schematic horizontal plane-sectional view of the deposition apparatus 700 shown in FIG. 8.

Referring to FIGS. 8 through 10, the deposition apparatus 700 according to the present embodiment includes a deposition source 710, a deposition source nozzle unit 720, a barrier plate assembly 740, a patterning slit sheet 730, a frame 735, and a stage 760.

The patterning slit sheet 730 may be disposed between the deposition source 710 and the substrate 2. The patterning slit sheet 730 is bonded to a frame 735 having a shape similar to a window frame. The patterning slit sheet 730 includes a plurality of patterning slits 731 arranged in the X-axis direction.

Since the patterning slit sheet 730, the frame 735, and the stage 760 are similar to those of the previous embodiments, detailed descriptions thereof are not provided here. In the present embodiment, the stage 760 is formed as a single-layered structure; however, two stacked stages as shown in FIGS. 6 and 7 may be used.

The deposition material 715 that has been vaporized in the deposition source 710 passes through the deposition source nozzle unit 720 and the patterning slit sheet 730 and is then deposited onto the substrate 2 that is a deposition target.

The deposition source 710 includes a crucible 711 that is filled with the deposition material 715 and a heater 712 that heats the crucible 711 so as to vaporize the deposition material 715 toward a side of the crucible 711 filled with the deposition material 715, in particular, toward the deposition source nozzle unit 720. In addition, the deposition source nozzle unit 720 is disposed at a side of the deposition source 710, and the deposition source nozzle unit 720 includes a plurality of deposition source nozzles 721 arranged in the X-axis direction.

The barrier plate assembly 740 is disposed at a side of the deposition source nozzle unit 720. The barrier plate assembly 740 includes a plurality of barrier plates 741, and a barrier plate frame 742 that covers sides of the barrier plates 741. The plurality of barrier plates 741 may be arranged parallel to each other at equal intervals in the X-axis direction. In addition, each of the barrier plates 741 may be arranged parallel to a Y-Z plane in FIG. 8, and may have a rectangular shape. The plurality of barrier plates 741 arranged as described above partition the space between the deposition source nozzle unit 720 and the patterning slit sheet 730 into a plurality of sub-deposition spaces S. In the deposition apparatus 700 according to the present embodiment, as illustrated in FIG. 10, a deposition space is divided by the barrier plates 741 into sub-deposition spaces S that respectively correspond to the deposition source nozzles 721 through which the deposition material 715 is discharged. As described above, since the barrier plates 741 partition the space between the deposition source nozzle unit 720 and the patterning slit sheet 750 into the sub-deposition spaces S, the deposition material 715 discharged through each of the deposition source nozzles 721 is not mixed with the deposition material discharged through the other deposition source nozzles 721, and passes through the patterning slits 731 so as to be deposited on the substrate 2. In other words, the barrier plates 741 guide the deposition material 715, which is discharged through the deposition source nozzles 721, to move straight to not flow in the X-axis direction.

As described above, by ensuring the linearity of the deposition material via the barrier plates 741, a smaller shadow zone may be formed on the substrate 2, and thus, the deposition apparatus 700 and the substrate 2 can be separated from each other by a set or predetermined distance.

The barrier plate assembly 740 may selectively include a connection member 745, which may be connected to the frame 735 of the patterning slit sheet 730.

Also, the process of deposition on the substrate 2 may be performed while the substrate 2 fixed by the electrostatic chuck 600 moves relative to the deposition apparatus 700.

Although not shown in FIGS. 8 through 10, a plurality of the deposition apparatuses 700 of the present embodiment may be disposed so that the deposition processes may be sequentially performed while the substrate 2 sequentially passes through the plurality of deposition apparatuses 700. Also, the separation area is formed between the frame 735 and the stage 760 like in the previous embodiments.

Figure 11:
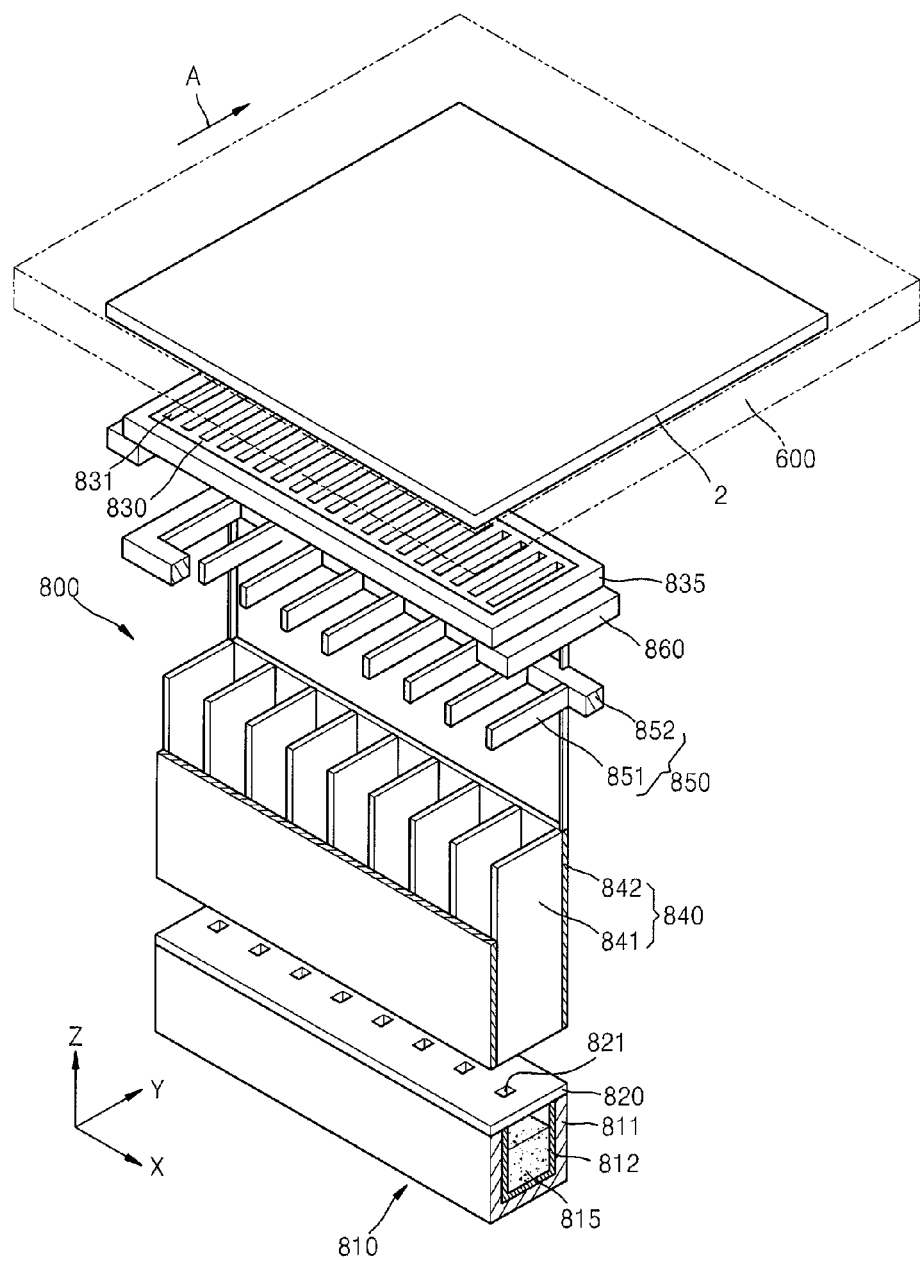
FIG. 11 is a schematic perspective view of a deposition apparatus according to another embodiment of the present invention.

FIG. 11 is a schematic perspective view of a deposition apparatus 800 according to another embodiment of the present invention. For the convenience of description, differences from the previous embodiment will be described below.

Referring to FIG. 11, the deposition apparatus 800 may include a deposition source 810, a deposition source nozzle unit 820, a first barrier plate assembly 840, a second barrier plate assembly 850, a patterning slit sheet 830, a frame 835, and a stage 860.

The patterning slit sheet 830 may be disposed between the deposition source 810 and the substrate 2. The patterning slit sheet 830 is coupled to the frame 835 having a shape similar to a window frame. The patterning slit sheet 830 includes a plurality of patterning slits 831 arranged in the X-axis direction.

Since the patterning slit sheet 830, the frame 835, and the stage 860 have the same structures as those of the previous embodiments, detailed descriptions thereof are not provided here. In the present embodiment, the stage 860 is formed as a single-layered structure; however, two stacked stages as shown in FIGS. 6 and 7 may be used.

Also, the deposition source 810 and the first barrier plate assembly 840 are the same as those of the embodiment described with reference to FIG. 8, and detailed descriptions thereof are not provided. The present embodiment is different from the previous embodiment in that the second barrier plate assembly 850 is disposed at a side of the first barrier plate assembly 840.

In more detail, the second barrier plate assembly 850 includes a plurality of second barrier plates 851, and a second barrier plate frame 852 that covers sides of the second barrier plates 851. The plurality of second barrier plates 851 may be arranged parallel to each other at equal intervals in the X-axis direction. In addition, each of the second barrier plates 851 may be formed to extend in the YZ plane in FIG. 11, i.e., perpendicular to the X-axis direction.

The plurality of first barrier plates 841 and second barrier plates 851 arranged as described above partition the space between the deposition source nozzle unit 820 and the patterning slit sheet 830. The deposition space is divided by the first barrier plates 841 and the second barrier plates 851 into sub-deposition spaces that respectively correspond to the deposition source nozzles 821 through which the deposition material is discharged.

The second barrier plates 851 may be disposed to correspond respectively to the first barrier plates 841. The second barrier plates 851 may be respectively aligned with the first barrier plates 841 to be parallel thereto on the same plane as the first barrier plates 841. Each pair of the corresponding first and second barrier plates 841 and 851 may be located on the same plane. Although the first barrier plates 841 and the second barrier plates 851 are respectively illustrated as having the same thickness in the X-axis direction, aspects of the present invention are not limited thereto. In other words, the second barrier plates 851, which need to be accurately aligned with the patterning slits 831, may be formed to be relatively thin, whereas the first barrier plates 841, which do not need to be precisely aligned with the patterning slits 831, may be formed to be relatively thick. This makes it easier to manufacture the organic layer deposition assembly.

Also, the substrate 2 is moved relative to the deposition apparatus 800 in a state of being fixed by the electrostatic chuck 600, and thus, the deposition process may be performed.

In addition, although not shown in FIG. 11, a plurality of the deposition apparatuses 800 may be disposed according to the present embodiment so that the deposition is performed while the substrate 2 may pass through each of the deposition apparatuses 800 sequentially. Also, the separation area (SA) may be formed between the frame 835 and the stage 860 like in the previous embodiments.

Figure 12:
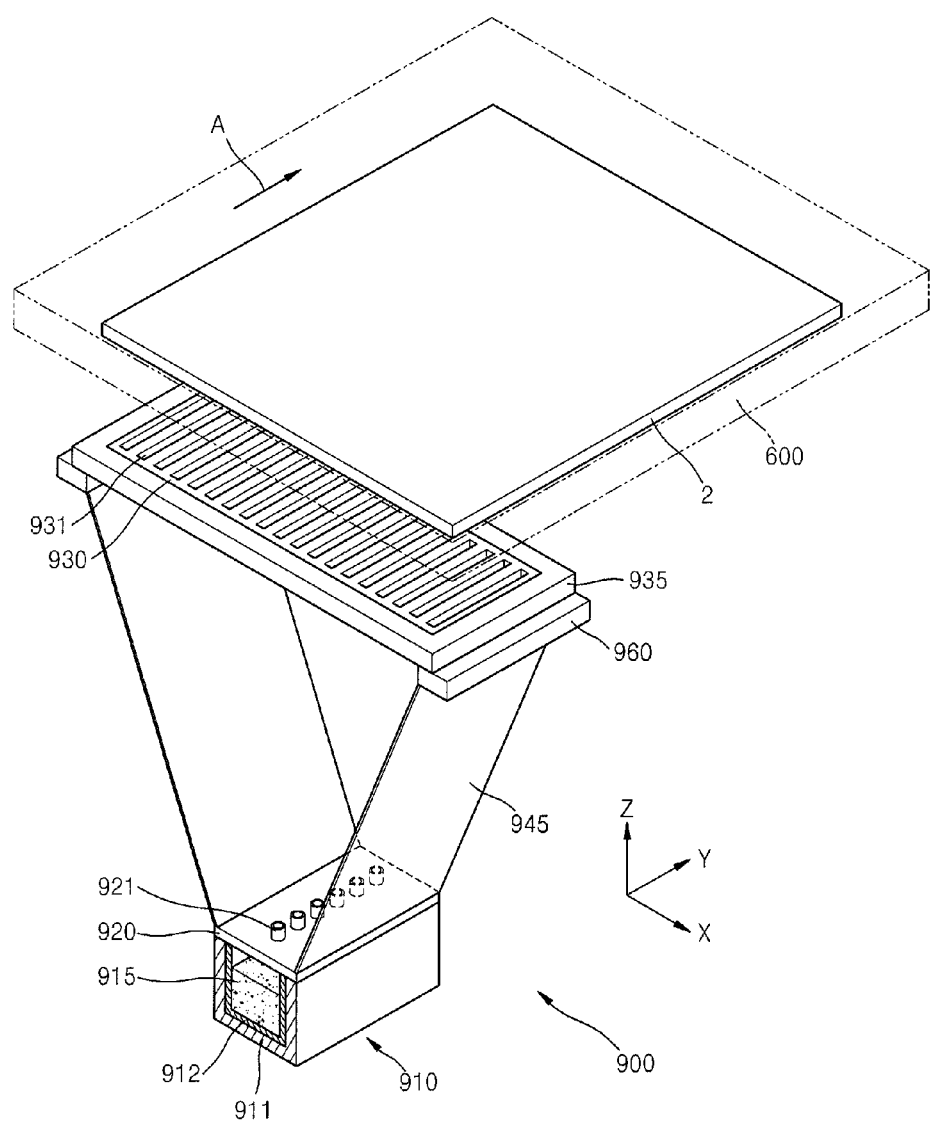
FIG. 12 is a schematic perspective view of a deposition apparatus according to another embodiment of the present invention.

FIG. 12 is a schematic perspective view of a deposition apparatus 900 according to another embodiment of the present invention. For the convenience of description, differences from previous embodiments will be described below.

Referring to FIG. 12, the deposition apparatus 900 according to the present embodiment includes a deposition source 910, a deposition source nozzle unit 920, a patterning slit sheet 930, a frame 935, and a stage 960.

The patterning slit sheet 930 may be disposed between the deposition source 910 and the substrate 2. The patterning slit sheet 930 may be coupled to the frame 935 having a shape similar to a window frame. The patterning slit sheet 930 includes a plurality of patterning slits 931 arranged in the X-axis direction.

Since the patterning slit sheet 930, the frame 935, and the stage 960 have the same structures as those of the previous embodiments, detailed descriptions thereof are not provided here. In the present embodiment, the stage 960 is formed as a single-layered structure; however, two stacked stages as shown in FIGS. 6 and 7 may be used.

Here, the deposition source 910 includes a crucible 911 that is filled with a deposition material 915, and a heater 912 that heats the crucible 911 to vaporize the deposition material 915, which is contained in the crucible 911, so as to move the vaporized deposition material 915 to the deposition source nozzle unit 920. The deposition source nozzle unit 920 is disposed at a side of the deposition source 910. The deposition source nozzle unit 920 includes a plurality of deposition source nozzles 921 arranged in the Y-axis direction.

In addition, the deposition source 910, the deposition source nozzle unit 920, and the patterning slit sheet 930 may be connected to each other by a connection member 945. The connection member 945 may guide a proceeding passage of the deposition material 915.

The deposition source nozzle unit 920 includes the plurality of deposition source nozzles 921 arranged at equal intervals in the Y-axis direction, i.e., a scanning direction of the substrate 2. The deposition material 915 that is vaporized in the deposition source 910 passes through the deposition source nozzle unit 920 towards the substrate 2 which constitutes a deposition target. As described above, the deposition source nozzle unit 920 includes the plurality of deposition source nozzles 921 arranged in the Y-axis direction, that is, the scanning direction of the substrate 2. In one embodiment, there is only one line of deposition source nozzles 921 in the X-axis direction, and thus no shadow zone may be formed on the substrate 2. In addition, since the plurality of deposition source nozzles 921 are arranged in the scanning direction of the substrate 2, even if there is a difference in flux between the deposition source nozzles 921, the difference may be compensated for and deposition uniformity may be maintained constant.

Also, the substrate 2 is moved relative to the deposition apparatus 900 in a state of being fixed by the electrostatic chuck 600, and thus, the deposition process may be performed.

In addition, although not shown in FIG. 12, a plurality of the deposition apparatuses 900 may be disposed according to the present embodiment so that the deposition is performed while the substrate 2 may pass through each of the deposition apparatuses 900 sequentially. Also, the separation area (SA) may be formed between the frame 935 and the stage 960 like in the previously described embodiments.

Figure 13:
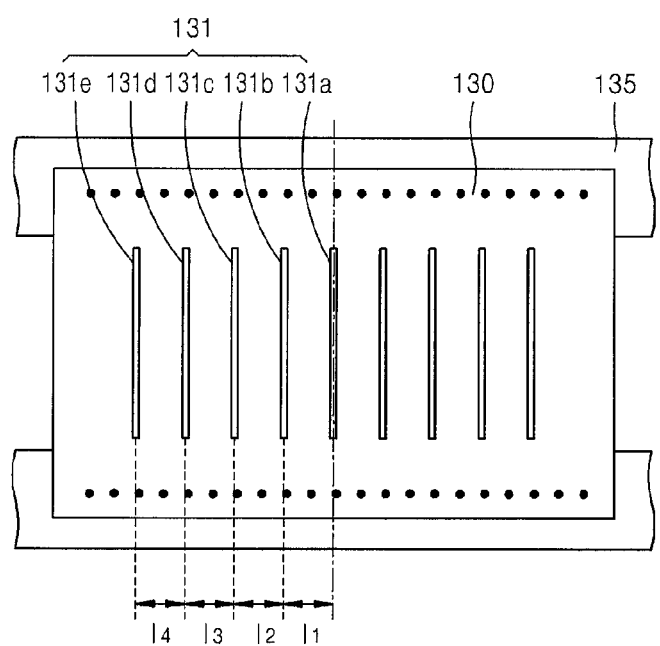
FIG. 13 is a diagram showing patterning slits formed at equal intervals in a patterning slit sheet of the deposition apparatus shown in FIG. 4.
Figure 14:
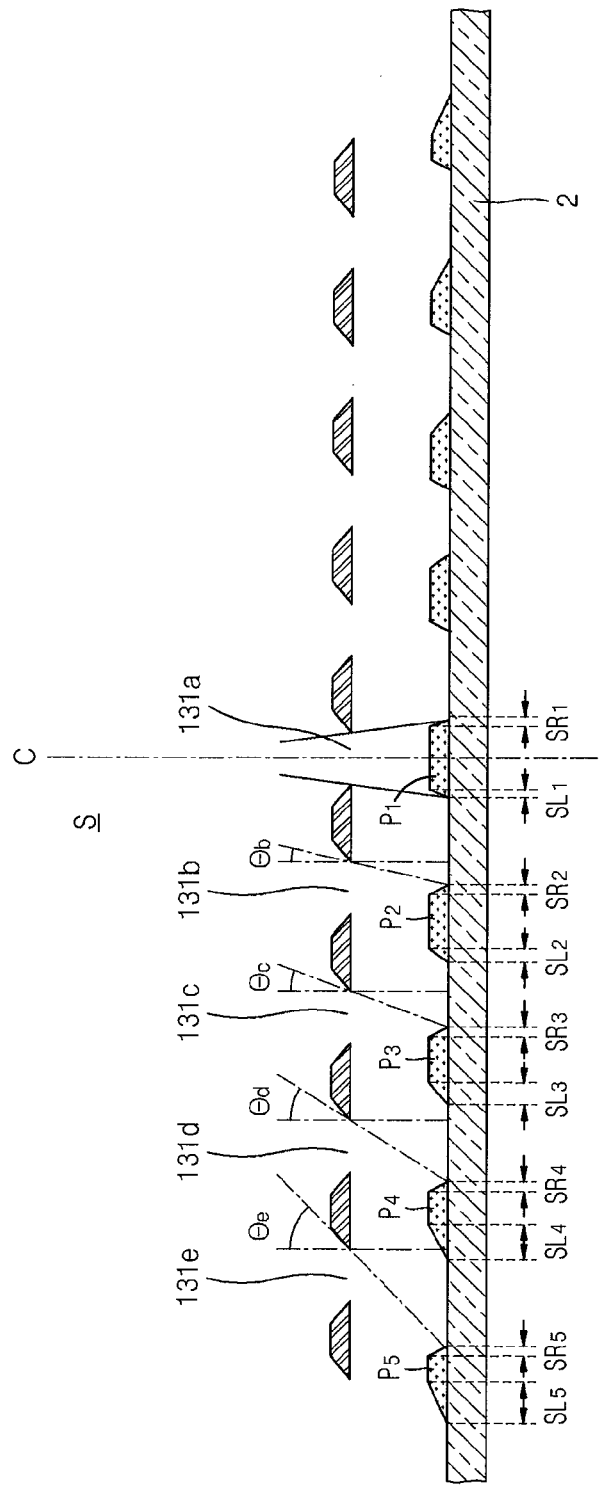
FIG. 14 is a diagram showing a deposition layer formed on a substrate by using the patterning slit sheet of FIGS. 13.

FIG. 13 is a diagram showing the patterning slit sheets formed at equal intervals in the patterning slit sheet of the organic layer deposition apparatus shown in FIG. 4, and FIG. 14 is a diagram showing a deposition layer formed on the substrate by the patterning slit sheets shown in FIG. 13.

FIGS. 13 and 14 illustrate the patterning slit sheet 130 in which the patterning slits 131 are arranged at equal intervals. That is, in FIG. 13, the patterning slits 131 satisfy the following condition: $I_1 = I_2 = I_3 = I_4$.

In this embodiment, an incident angle of a deposition material discharged along a centerline C of a deposition space S is substantially perpendicular to the substrate 2. Thus, a deposition layer $P_1$ formed using the deposition material that has passed through a patterning slit 131*a* has a minimum size of a shadow, and a right-side shadow $SR_1$ and a left-side shadow $SL_1$ are formed symmetrical to each other. Here, the deposition space S is a space on which the deposition pattern is formed on the substrate 2 by using the patterning slits 131.

However, a critical incident angle θ of the deposition material that passes through patterning slits disposed farther from the centerline C of the deposition space S gradually increases, and thus, the critical incident angle θ of the deposition material that passes through the outermost patterning slit 131*e* is approximately 55°. Accordingly, the deposition material is incident at an inclination with respect to the patterning slit 131*e*, and a deposition layer $P_5$ formed using the deposition material that has passed through the patterning slit 131*e* has the largest shadow. In particular, a left-side shadow $SR_5$ is larger than a right-side shadow $SR_5$.

That is, as the critical incident angle θ of the deposition material increases, the size of the shadow also increases. In particular, the size of the shadow at a position farther from the centerline C of the deposition space S increases. In addition, the critical incident angle θ of the deposition material increases as a distance between the centerline C of the deposition space S and the respective patterning slits increases. Thus, organic layers formed using the deposition material that passes through the patterning slits disposed farther from the centerline C of the deposition space S have a larger shadow size. In particular, of the shadows on both sides of the respective organic layers, the size of the shadow at a position farther from the centerline C of the deposition space S is larger than that of the other.

That is, referring to FIG. 14, the deposition layers formed on the left side of the centerline C of the deposition space S have a structure in which a left hypotenuse is larger than a right hypotenuse, and the deposition layers formed on the right side of the centerline C of the deposition space S have a structure in which a right hypotenuse is larger than a left hypotenuse.

In addition, in the organic layers formed on the left side of the centerline C of the deposition space S, the length of the left hypotenuse increases towards the left. In the organic layers formed on the right side of the centerline C of the deposition space S, the length of the right hypotenuse increases towards the right. Consequently, the deposition layers formed in the deposition space S may be formed symmetrical to each other about the centerline C of the deposition space S.

In this regard, the critical incident angles satisfy the following condition: $\theta_b < \theta_c < \theta_d < \theta_e$, and thus, the sizes of the shadows of the organic layers also satisfy the following condition: $SL_1 < SL_2 < SL_3 < SL_4 < SL_5$.

Figure 15:
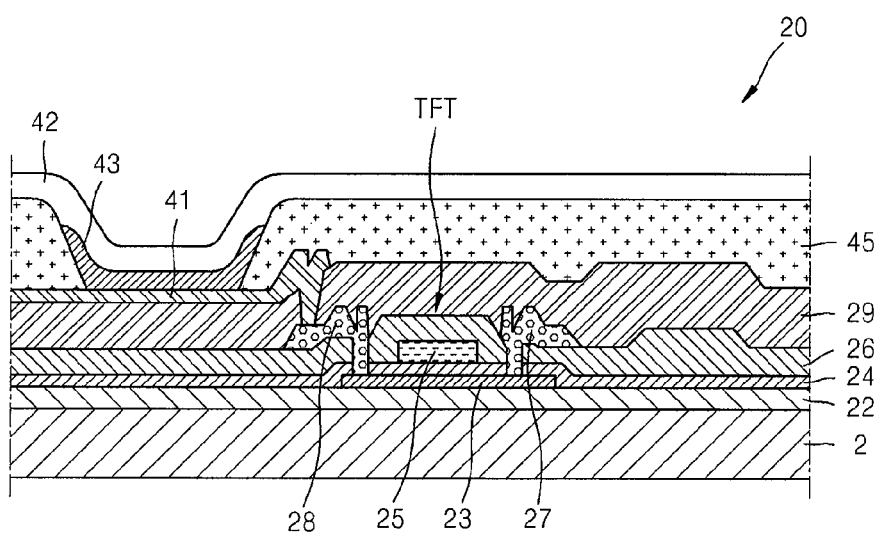
FIG. 15 is a schematic cross-sectional view of an organic light emitting display apparatus manufactured by using a deposition apparatus according to an embodiment of the present invention.

FIG. 15 is a cross-sectional view of an organic light-emitting display apparatus 20 manufactured by using a deposition apparatus according to an embodiment of the present invention.

The organic light emitting display apparatus 20 will be described in more detail below.

A buffer layer 22 is formed on the substrate 2. The substrate 2 may be formed of a glass material, a plastic material that is flexible, or other various materials. The buffer layer 22 prevents impurities from infiltrating into the substrate 2 and planarizing the substrate 2, and may be formed of various materials capable of performing the above functions. The buffer layer 22 is not an essential element, and thus, may be omitted.

An active layer 23 of a set or predetermined pattern is formed on the buffer layer 22. The active layer 23 may be formed of inorganic semiconductor such as amorphous silicon or polysilicon, organic semiconductor, or oxide semiconductor.

A gate insulating layer 24 is formed on the active layer 23, and a gate electrode 25 is formed on a set or predetermined region on the gate insulating layer 24. The gate insulating layer 24 is formed for insulating the active layer 23 and the gate electrode 25 from each other, and may be formed of an organic material or an inorganic material such as SiNx and SiO$_2$.

The gate electrode 25 may include Au, Ag, Cu, Ni, Pt, Pd, Al, Mo, or an alloy such as Al:Nd alloy or Mo:W alloy; however, the present invention is not limited thereto, that is, the gate electrode 25 may be formed of various materials in consideration of attachability to adjacent layers, flatness, electric resistance, and processability.

An interlayer dielectric 26 is formed on the gate electrode 25. The interlayer dielectric 26 and the gate insulating layer 24 are formed to expose source and drain regions of the active layer 23, and a source electrode 27 and a drain electrode 28 are formed to contact the exposed source and drain regions of the active layer 23.

The source electrode 27 and the drain electrode 28 may be formed of various conductive materials to have a single-layered structure or a multi-layered structure.

A passivation layer 29 is formed on a thin film transistor (TFT). In particular, the passivation layer 29 is formed on the source electrode 27 and the drain electrode 28.

The passivation layer 29 is formed to expose a set or predetermined region of the drain electrode 28, and a first electrode 41 is formed to contact the exposed region of the drain electrode 28.

A pixel defining layer 45 is formed of an insulating material on the first electrode 41. The pixel defining layer 45 is formed to expose a set or predetermined region of the first electrode 41, and an intermediate layer 43 including an organic emission layer is formed to contact the exposed portion of the first electrode 41. In addition, a second electrode 42 is formed to contact the intermediate layer 43.

The intermediate layer 43 including the organic emission layer may be formed of a low-molecular weight organic material or a high-molecular weight organic material. When the organic emission layer is formed of the low-molecular weight organic material, a single or multi-layer structure including a hole injection layer (HIL), a hole transport layer (HTL), an organic emission layer, an electron transport layer (ETL), and an electron injection layer (EIL) may be formed.

Here, the intermediate layer 43 including the organic emission layer may be formed by the deposition apparatus 1, 1', 1'', 1000, 700, 800, or 900 described above.

That is, after forming the first electrode 41 on the substrate 2 and forming the pixel defining layer 45, the intermediate layer 43 may be formed by using the above described deposition apparatus 1, 1', 1'', 1000, 700, 800, or 900.

In particular, when using the deposition apparatus 1000 shown in FIG. 4, a red organic emission layer, a green organic emission layer, a blue organic emission layer, and an auxiliary emission layer may be sequentially formed on the first electrode 41 on the substrate 2 by using the plurality of deposition assemblies 100-1 through 100-11 in the deposition apparatus 1000.

The first electrode 41 may include indium tin oxide (ITO), indium zinc oxide (IZO), ZnO, In$_2$O$_3$, or Ag, Mg, Al, Pt, Pd, Au, Ni, Nd, Ir, Cr, and a compound thereof.

The second electrode 42 may include Li, Ca, LiF/Ca, LiF/Al, Al, Ag, Mg, and a compound thereof, or ITO, IZO, ZnO, In$_2$O$_3$.

A sealing member may be disposed on the second electrode 42. The sealing member is formed to protect the intermediate layer 43 or other layers against external moisture or oxygen, and may be formed of a plastic material or a stacked substance of an organic material and an inorganic material.

According to the deposition apparatus, the organic light emitting display apparatus, and the method of manufacturing the organic light emitting display apparatus of the present invention, characteristics of deposition layers may be improved easily.

While the present invention has been particularly shown and described with reference to some example embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing an organic light emitting display apparatus by using a deposition apparatus, the method comprising:
fixing a substrate on a transfer unit in a loading unit;
conveying the transfer unit on which the substrate is fixed into a chamber via a first conveyor unit that is installed to pass through the chamber;

forming a deposition layer by depositing a deposition material ejected from a deposition assembly on the substrate while one of the substrate or the deposition assembly moves relative to the other in a state in which the deposition assembly disposed in the chamber and the substrate are separated by a gap from each other;

separating the substrate on which the deposition material is deposited from the transfer unit in an unloading unit; and conveying the transfer unit, from which the substrate is separated, to the loading unit via a second conveyor unit that is configured to pass through the chamber, wherein the deposition assembly comprises a deposition source, a patterning slit sheet, a frame coupled to the patterning slit sheet, and a stage bonded to the frame, and the substrate and the patterning slit sheet are aligned with each other by using the stage, wherein a separation area is formed between the frame and the stage.

2. The method of claim 1, wherein the deposition apparatus comprises a plurality of deposition assemblies, and the deposition is performed successively on the substrate while the substrate passes through the plurality of deposition assemblies, and each of the deposition assemblies comprises a respective one of the deposition source, the patterning slit sheet, the frame, and the stage.

3. The method of claim 2, wherein each of the plurality of deposition assemblies ejects a deposition material separately from each other.

4. The method of claim 1, wherein the transfer unit circulates between the first conveyor unit and the second conveyor unit.

5. The method of claim 1, wherein the transfer unit is conveyed in the chamber in a non-contact manner with the first conveyor unit.

* * * * *